(12) United States Patent
Anand

(10) Patent No.: US 6,362,528 B2
(45) Date of Patent: *Mar. 26, 2002

(54) SEMICONDUCTOR DEVICE AND METHOD OF MANUFACTURING THE SAME

(75) Inventor: Minakshisundaran Balasubramanian Anand, Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/915,398

(22) Filed: Aug. 20, 1997

(30) Foreign Application Priority Data

Aug. 21, 1996 (JP) ................................ 8-219987

(51) Int. Cl.⁷ .......................... H01L 23/48; H01L 23/52; H01L 29/40
(52) U.S. Cl. ........................................ 257/758; 257/784
(58) Field of Search ................................. 257/784, 758, 257/780, 786, 750, 751; 438/612, 634

(56) References Cited

U.S. PATENT DOCUMENTS

| | | | | |
|---|---|---|---|---|
| 4,832,789 A | * | 5/1989 | Cochran et al. | 257/758 |
| 5,084,752 A | | 1/1992 | Satoh et al. | 357/68 |
| 5,288,661 A | | 2/1994 | Satoh et al. | 437/195 |
| 5,525,546 A | * | 6/1996 | Harada et al. | 437/209 |
| 5,565,378 A | * | 10/1996 | Harada et al. | 438/612 |
| 5,659,201 A | * | 8/1997 | Wollesen | 257/758 |
| 5,686,762 A | * | 11/1997 | Langley | 257/784 |

FOREIGN PATENT DOCUMENTS

| | | | |
|---|---|---|---|
| EP | 0 710 981 | 5/1996 | |
| GB | 2268329 | 1/1994 | |
| JP | 58-197865 | 11/1983 | |
| JP | 1-308036 | * 12/1989 | 257/784 |
| JP | 2-235350 | * 9/1990 | 257/780 |
| JP | 2-281743 | * 11/1990 | 257/784 |
| JP | 4-258145 | * 9/1992 | 257/784 |
| JP | 6-318590 | 11/1994 | |
| JP | 07-130737 | 5/1995 | |
| WO | WO 96-14657 | 5/1996 | |

OTHER PUBLICATIONS

EPO Search and Examination Report for EPO Appl. No. EP 97 11 4374, Aug. 26, 1999.
EPC Search and Examination Report for EPC Appl. No. 9703001–9, May 7, 1999.

* cited by examiner

Primary Examiner—Phat X. Cao
(74) Attorney, Agent, or Firm—Finnegan, Henderson, Farabow, Garrett & Dunner, L.L.P.

(57) ABSTRACT

In the present invention, the bonding pad is formed in a lattice-like shape. Directly underneath the passivation layer, the etching stopper layer is provided. An opening is made through the passivation layer and the etching stopper layer so as to expose the bonding pad. The cavity sections of the lattice-like shape of the bonding pad are filled with the insulating layer. The bonding wire is connected to the lattice-shaped bonding pad. With this structure, the bonding error of the device manufactured by the damascening process can be avoided.

12 Claims, 22 Drawing Sheets

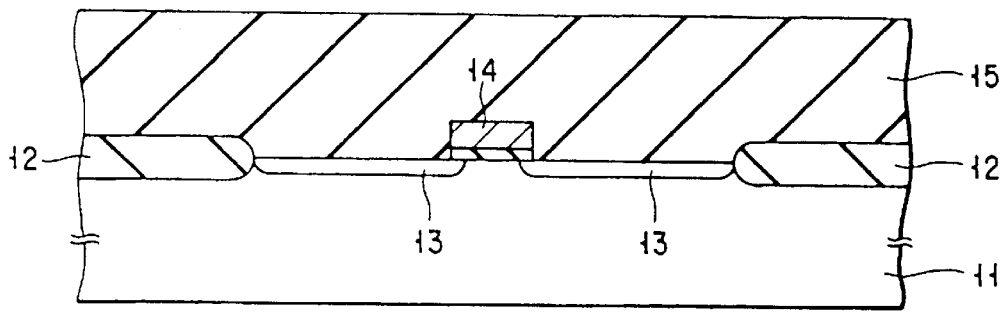
F I G. 8
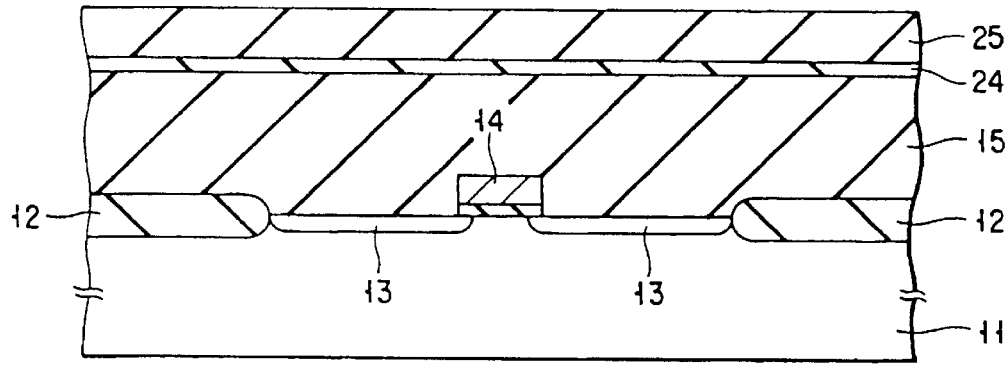
F I G. 9
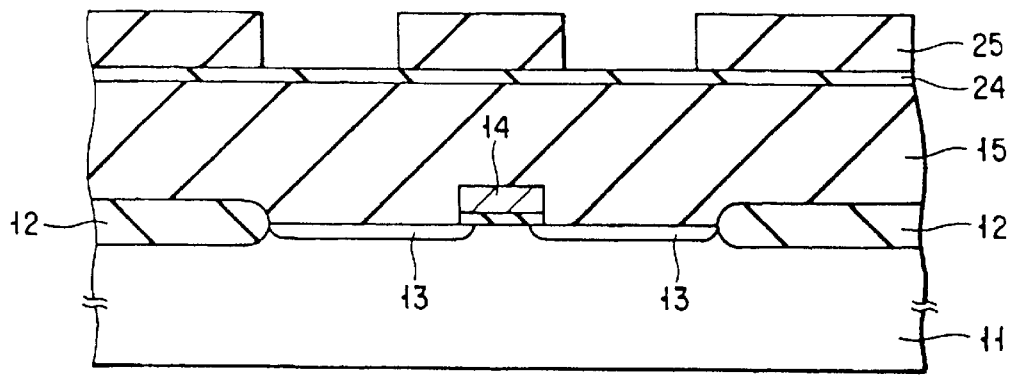
F I G. 10

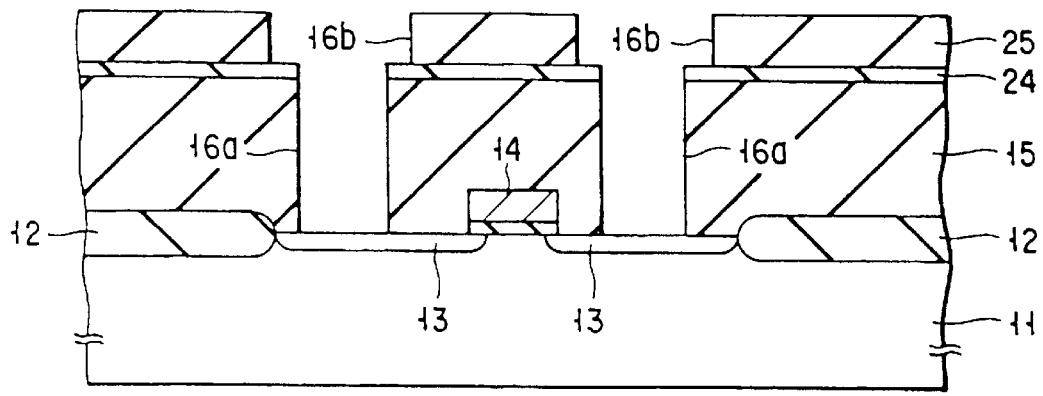
F I G. 11
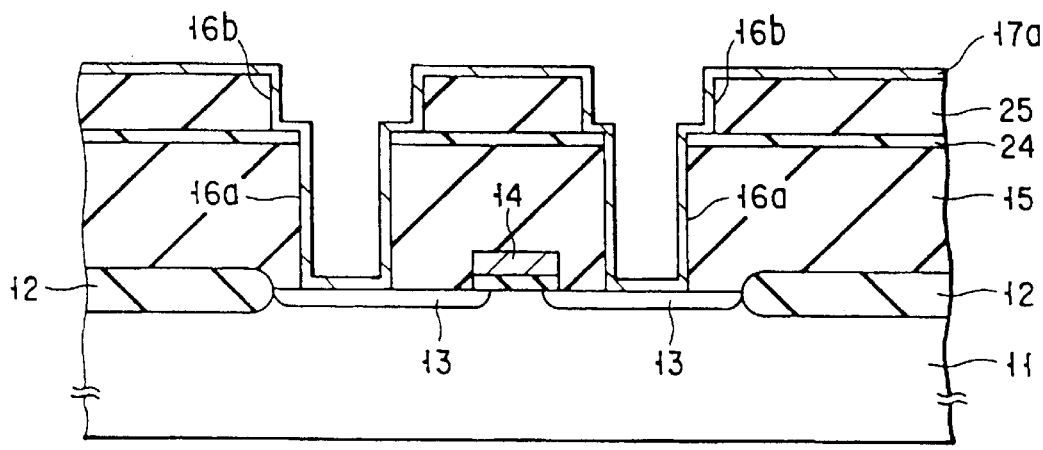
F I G. 12
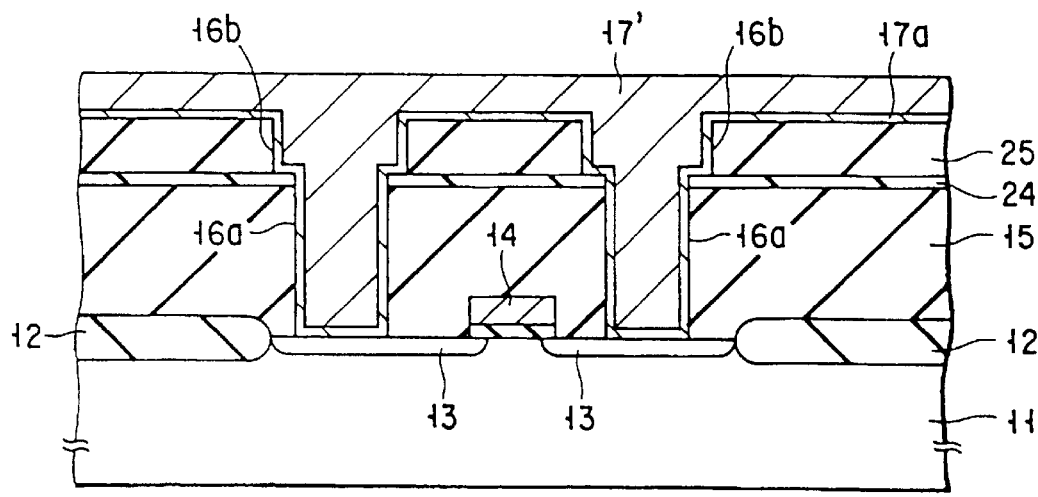
F I G. 13

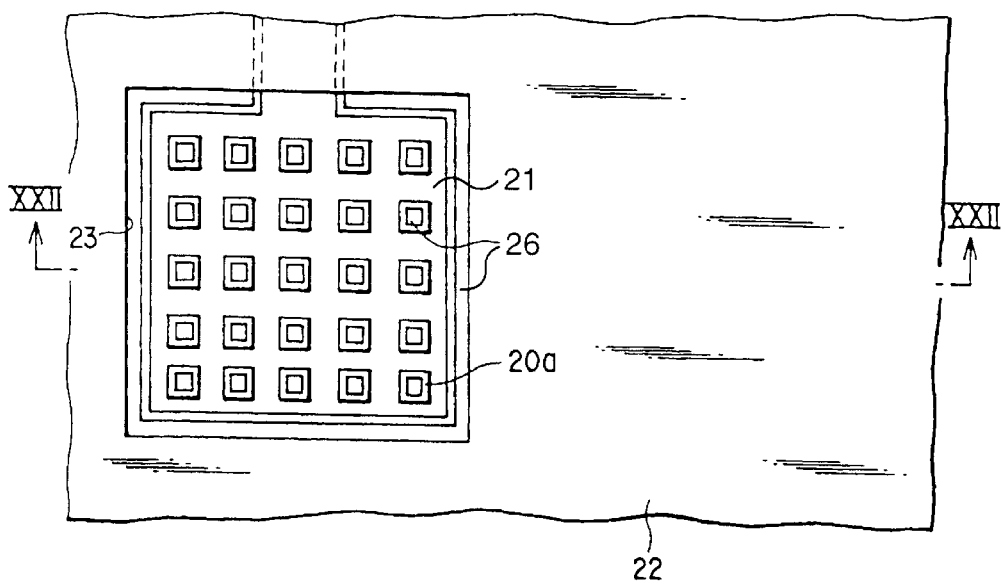
F I G. 21
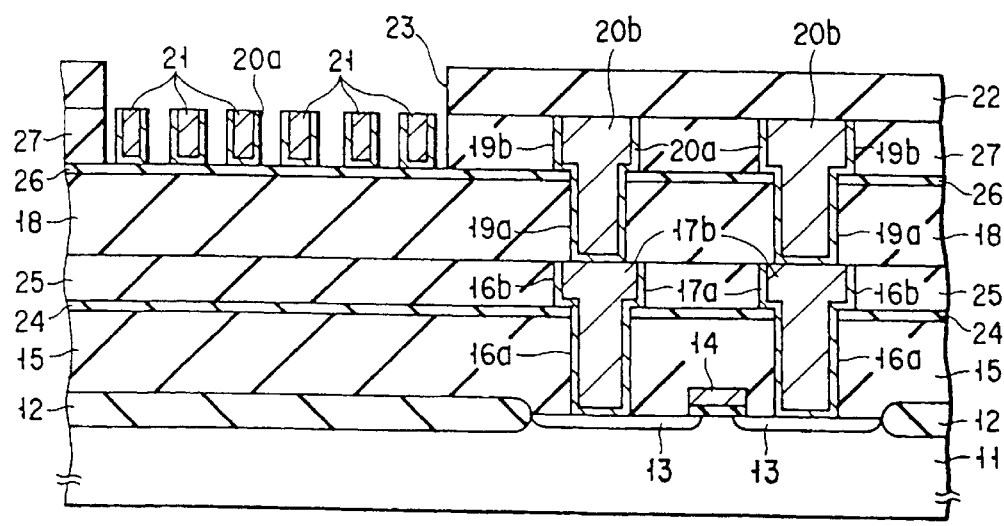
F I G. 22

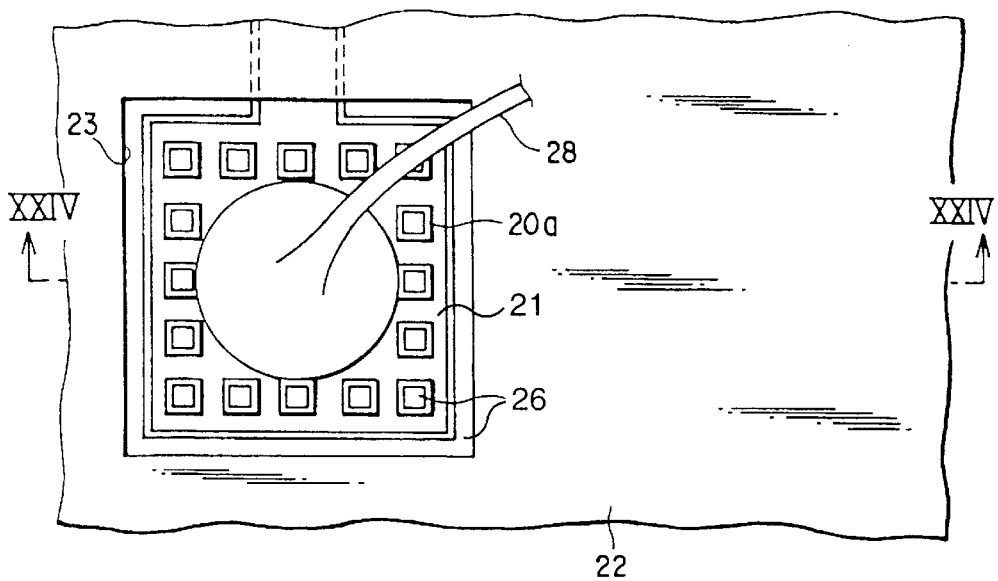
F I G. 23
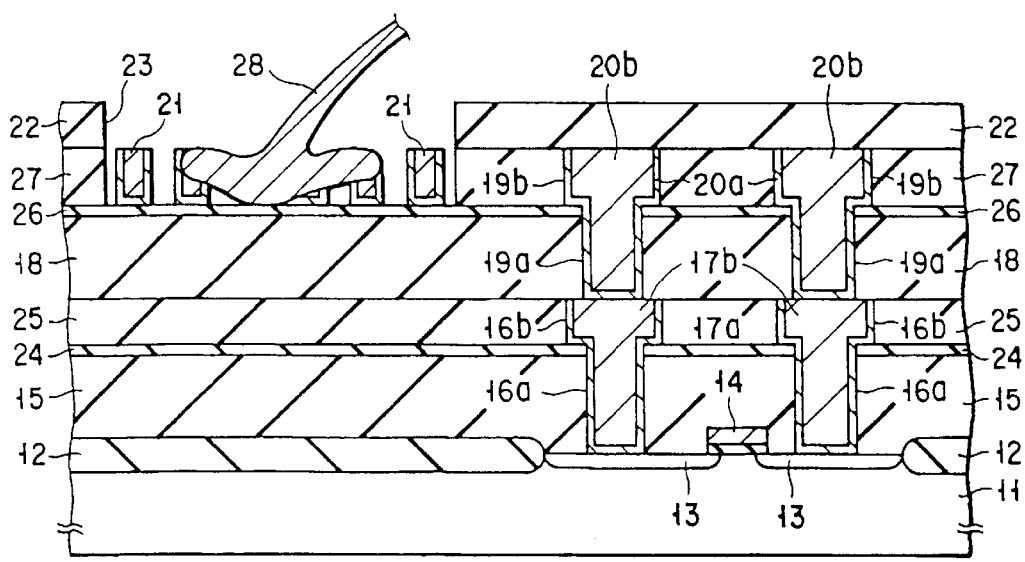
F I G. 24

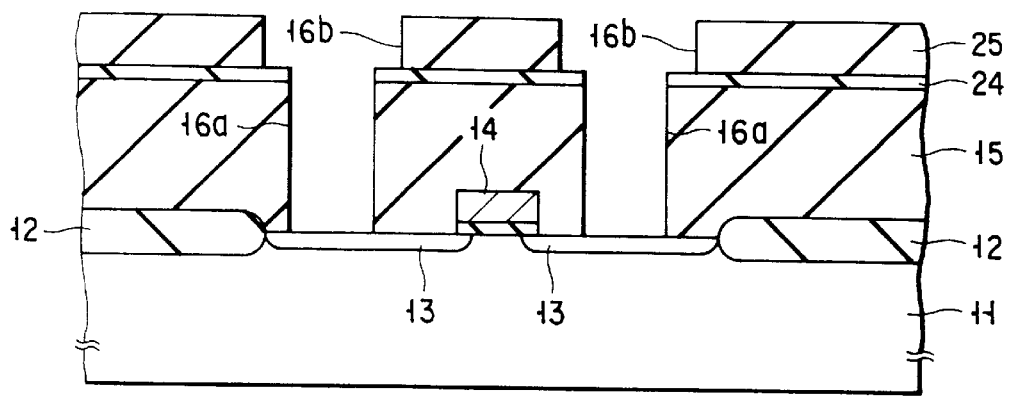
F I G. 30
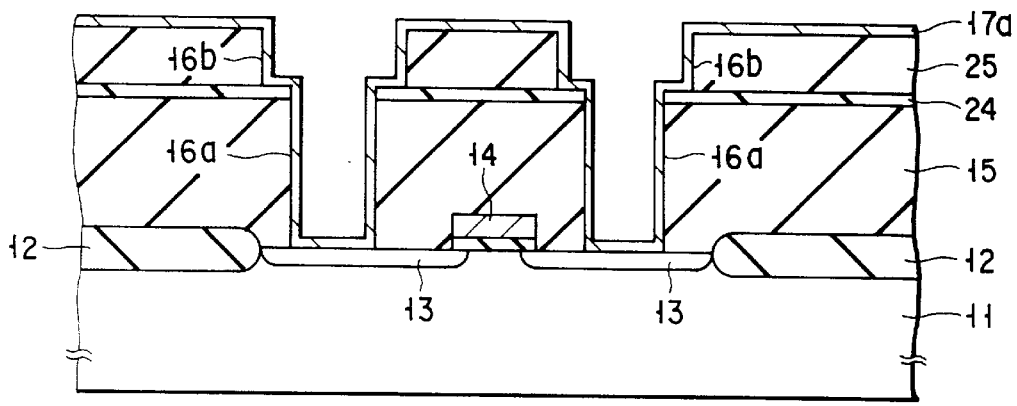
F I G. 31
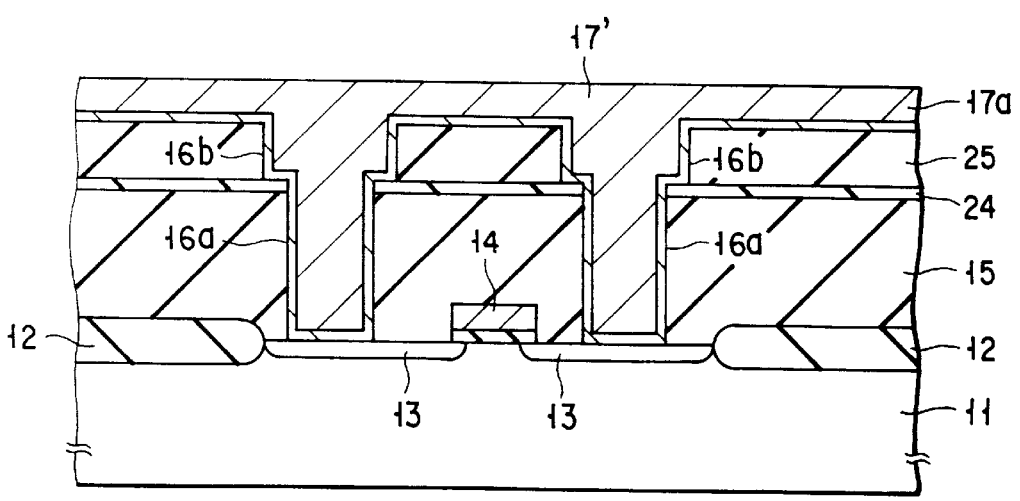
F I G. 32

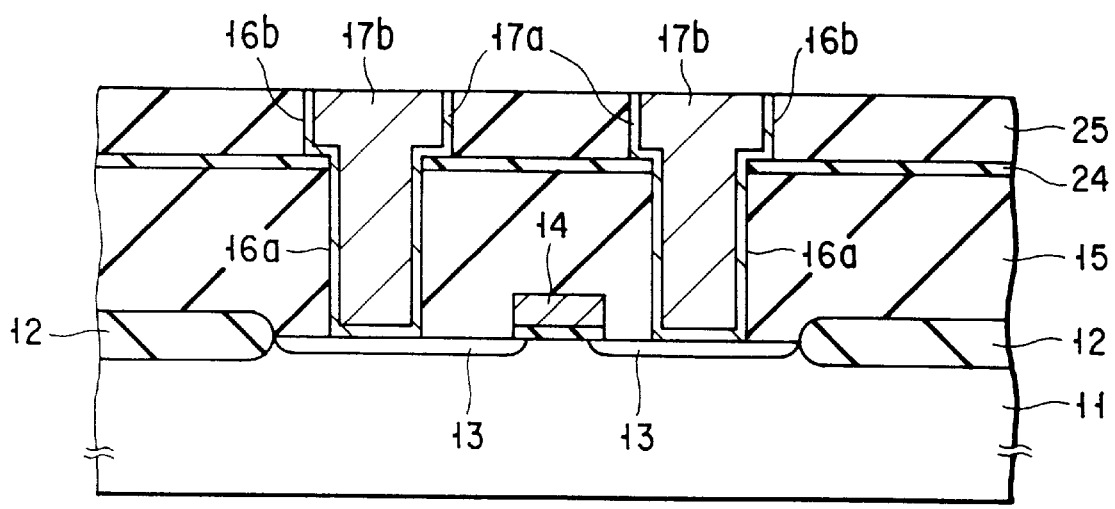
F I G. 33
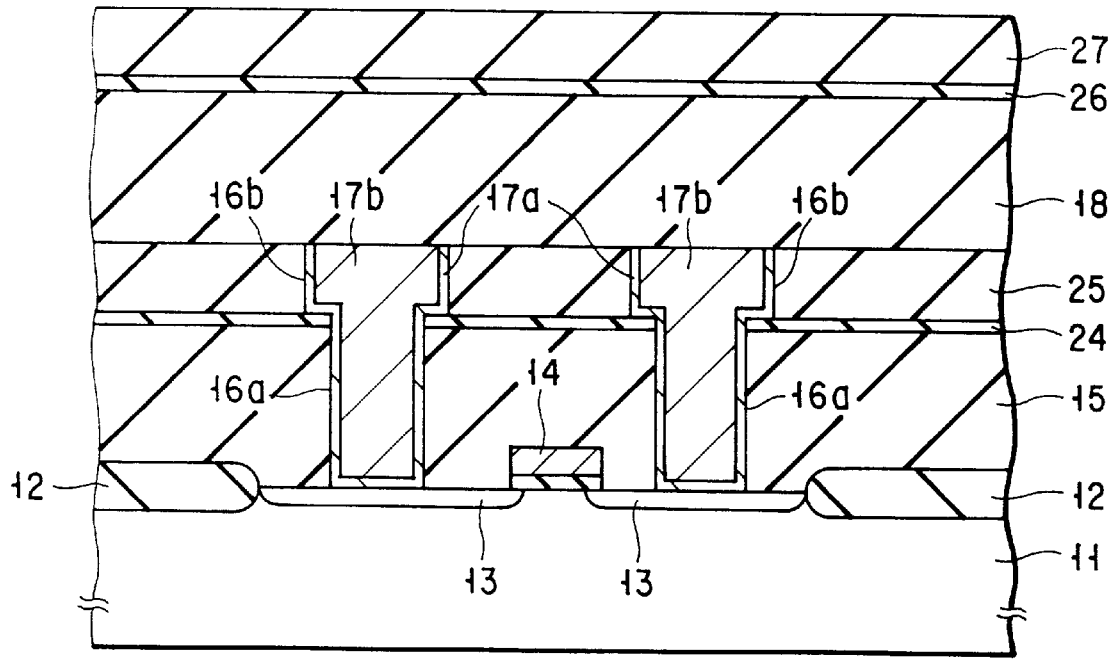
F I G. 34

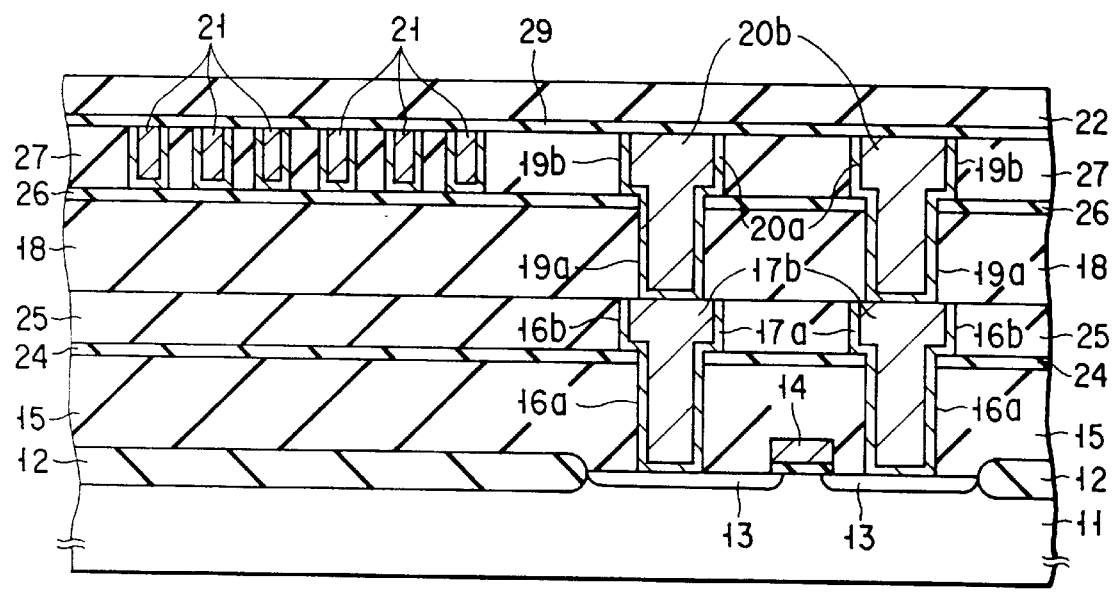
F I G. 39

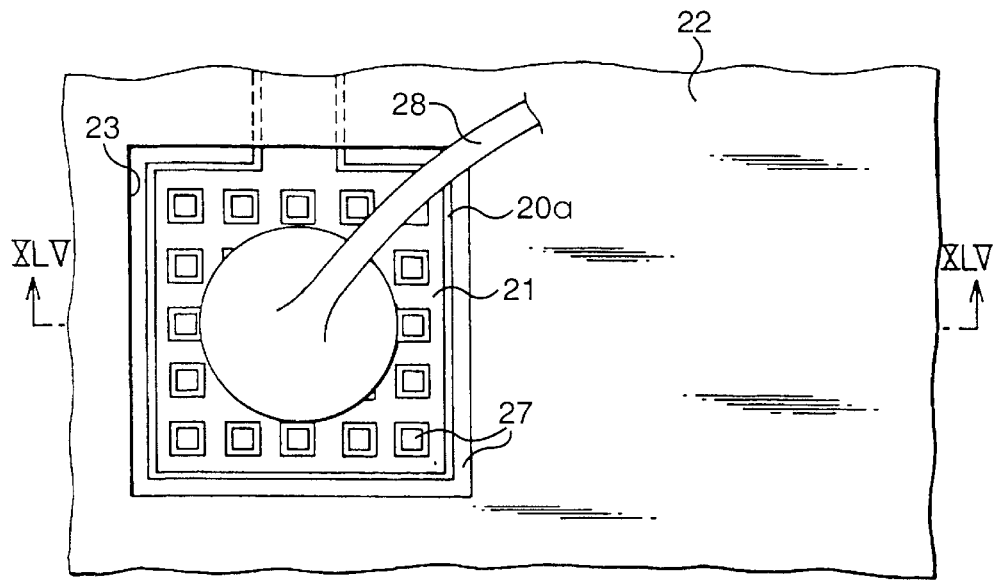
F I G. 44
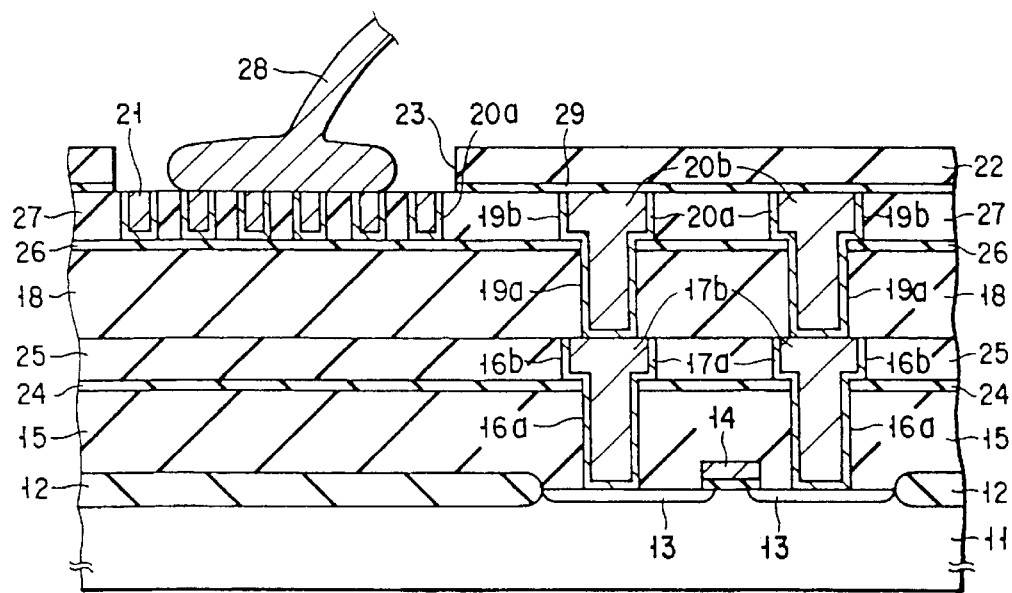
F I G. 45

SEMICONDUCTOR DEVICE AND METHOD OF MANUFACTURING THE SAME

BACKGROUND OF THE INVENTION

The present invention relates to a semiconductor device having a multi-layer wiring structure made by a damascening process or a dual damascening process, and a method of manufacturing such a device.

An ultra-large scale integrated circuit (ULSI) employs a multilayer wiring structure in which wiring layers of three levels or more are formed.

FIGS. 1 and 2 show a semiconductor device prepared by a conventional wiring process. FIG. 2 is a cross sectional view taken along the line II—II indicated in FIG. 1.

As can be seen in the figure, a field oxide layer 12 is formed on a semiconductor substrate 11. In an element region surrounded by the field oxide layer 12, a MOS transistor having a source-drain region 13 and a gate electrode 14, is formed.

On the semiconductor substrate 11, an insulating layer 15 is formed so as to completely cover the MOS transistor. A contact hole 16 is made in the insulating layer 15 from its surface to be through to the source-drain region 13. On the insulating layer 15, a first-level wiring layer having a plurality of wiring layers 17 is formed. Each of the plurality of wiring layers 17 is connected to the source-drain region 13 of the MOS transistor via the contact hole 16.

On the insulating layer 15, an insulating layer (interlayer dielectric) 18 is formed so as to completely cover the plurality of wiring layers 17. A contact hole 19 is made in the insulating layer 18 from its surface to be through to the plurality of wirings 17. On the insulating layer (interlayer dielectric) 18, a second-level wiring layer having a plurality of wiring layers 20 is formed. Each of the plurality of wiring layers 20 is connected to the wiring layers 17 of the first-level wiring layers via the contact hole 19.

On the insulating layer (interlayer dielectric) 18, a bonding pad 21 is formed. Further, on the insulating layer (interlayer dielectric) 18, an insulating layer (passivation dielectric) 22 is formed so as to completely cover the plurality of wiring layers 20 and the bonding pad 21. An opening 23 is made in the insulating film (passivation dielectric) 22 so as to expose the bonding pad 21.

In a semiconductor device manufactured by the conventional wiring process, a plurality of wirings 17 of the first-level wiring layer, a plurality of wirings 20 of the second-level wiring layer and the bonding pad 21 are formed by a photo engraving process (PEP), in which, a resist pattern is formed, and using the resist pattern as a mask, metal layers are etched by an anisotropic etching (such as RIE).

However, in an ULSI, the distance between wirings of the same level is becoming very narrow.

Therefore, the following drawbacks begin to arise.

First, it is very difficult to accurately pattern the wirings 17 and 20 of the wiring layers. This is because the resolution of the exposing device for forming resist patterns, cannot follow up wiring patterns which are becoming finer as the technology develops.

Second, it is very difficult to fill grooves resulting between wirings of the same level, with insulating layer, and therefore cavities are inevitably created between the wirings. This is because of a poor step coverage of the insulating layer. Such cavities adversely affect the multilayer wiring technique.

FIGS. 3 and 4 show a semiconductor device manufactured by a dual damascening process. FIG. 4 is a cross sectional view taken along the line IV—IV indicated in FIG. 3.

As can be seen in the figure, a field oxide layer 12 is formed on a semiconductor substrate 11. In an element region surrounded by the field oxide layer 12, a MOS transistor having a source-drain region 13 and a gate electrode 14, is formed.

On the semiconductor substrate 11, insulating layers 15 and 24 are formed so as to completely cover the MOS transistor. A contact hole 16 is made in the insulating layers 15 and 24 from its surface to be through to the source-drain region 13.

The insulating layer 25 is formed on the insulating layer 24. In the insulating layer 25, a plurality of grooves 16b used for forming a first-level wiring layer, is formed. Bottom sections of the plurality of grooves 16b are made through to the contact hole 16a.

A barrier metal 17a is formed on an inner surface of each of the contact hole 16a and the grooves 16. Further, on each of the barrier metals 17a, a metal (or metal alloy) portion 17b is formed so as to completely fill each of the contact hole 16a and the grooves 16b. The plurality of wirings which make the first level wiring layer, consist of the barrier metals 17a and the metal portions 17b.

The surface of the insulating layer 25 meets with that of the first-level wiring layer, and the surface is made flat. Each of the plurality of wirings which give rise to the first-level wiring layer, is connected to the source-drain region 13 of the MOS transistor.

On the insulating layer 25 and the first level wiring layer, the insulating layer (interlayer dielectric) 18 and the insulating layer 26 are formed. A contact hole 19a is formed in the insulating layers 18 and 26 from its surface to be through to the first-level wiring layer.

An insulating layer 27 is formed on the insulating film 26. A plurality of grooves 19b used for forming the second-level wiring layer, are formed in the insulating layer 27. Bottom sections of the plurality of grooves 19b are made through to the contact hole 19a.

A barrier metal 20a is formed on an inner surface of each of the contact hole 19a and the grooves 19b. Further, on each of the barrier metals 20a, a metal (or metal alloy) portion 20b is formed so as to completely fill each of the contact hole 19a and the grooves 19b. The plurality of wirings which make the second level wiring layer, consist of the barrier metals 20a and the metal portions 20b.

The surface of the insulating layer 27 meets with that of the second-level wiring layer, and the surface is made flat. Each of the plurality of wirings which give rise to the second-level wiring layer, is connected to the first-level wiring layer.

In the case where the second-level wiring layer is located as the uppermost layer, a part of the second-level wiring layer constitutes a bonding pad 21. The bonding pad 21 is made of a metal (or metal alloy), as in the case of the second-level wiring layer.

An insulating layer (passivation dielectric) 22 is formed on the insulation layer 27, the second-level wiring layer and the bonding pad 21. An opening 23 is made in the insulating layer 22 so as to expose the bonding pad 21.

Regarding the semiconductor device manufactured by the dual damascening process as described above, it is able to solve the drawbacks of the conventional wiring process, that is, the wiring pattern becoming out of focus when exposing, and the cavities resulting between wirings.

However, in the dual damascening process or damascening process, the chemical mechanical polishing (CMP) technique is employed. In the case where a bonding pad 21 is formed by the CMP technique, the central portion of the bonding pad 21 is excessively etched, resulting in dishing, that is, the bonding pad 21 is made into a dish-like shape.

FIG. 5 illustrates how dishing occurs.

More specifically, the CMP not only mechanically etch the metal layer 21', but also chemically etch it. Therefore, in the case where the metal layer 21 (bonding pad) remains in a groove 19b which has a width sufficiently large as compared to its depth (note that the size of a bonding pad is usually about 100 $\mu$m×100 $\mu$m), the central portion of the metal layer 21 in the groove 19b is excessively etched mainly by chemical etching.

Such dishing easily causes a bonding error, that is, a wire cannot be bonded to the bonding pad 21 accurately during a wiring bonding operation, which results in the deterioration of the production yield.

FIGS. 6 and 7 show a semiconductor device formed by the dual damascening process, which has been proposed to solve the problem of dishing. FIG. 7 is a cross sectional view taken along the line VII—VII indicated in FIG. 6.

As can be seen in the figure, a field oxide layer 12 is formed on a semiconductor substrate 11. In an element region surrounded by the field oxide layer 12, a MOS transistor having a source-drain region 13 and a gate electrode 14, is formed.

On the semiconductor substrate 11, insulating layers 15 and 24 are formed so as to completely cover the MOS transistor. A contact hole 16 is made in the insulating layers 15 and 24 from its surface to be through to the source-drain region 13.

The insulating layer 25 is formed on the insulating layer 24. In the insulating layer 25, a plurality of grooves 16b used for forming a first-level wiring layer, are formed. Bottom sections of the plurality of grooves 16b are made through to the contact hole 16a.

A barrier metal 17a is formed on an inner surface of each of the contact hole 16a and the grooves 16. Further, on each of the barrier metals 17a, a metal (or metal alloy) portion 17b is formed so as to completely fill each of the contact hole 16a and the grooves 16b. The plurality of wirings which make the first level wiring layer, consist of the barrier metals 17a and the metal portions 17b.

The surface of the insulating layer 25 meets with that of the first-level wiring layer, and the surface is made flat. Each of the plurality of wirings which give rise to the first-level wiring layer, is connected to the source-drain region 13 of the MOS transistor.

On the insulating layer 25 and the first level wiring layer, the insulating layer (interlayer dielectric) 18 and the insulating layer 26 are formed. A contact hole 19a is formed in the insulating layers 18 and 26 from its surface to be through to the first-level wiring layer.

An insulating layer 27 is formed on the insulating film 26. A plurality of grooves 19b used for forming the second-level wiring layer, are formed in the insulating layer 27. Bottom sections of the plurality of grooves 19b are made through to the contact hole 19a.

A barrier metal 20a is formed on an inner surface of each of the contact hole 19a and the grooves 19b. Further, on each of the barrier metals 20a, a metal (or metal alloy) portion 20b is formed so as to completely fill each of the contact hole 19a and the grooves 19b. The plurality of wirings which make the second level wiring layer, consist of the barrier metals 20a and the metal portions 20b.

The surface of the insulating layer 27 meets with that of the second-level wiring layer, and the surface is made flat. Each of the plurality of wirings which give rise to the second-level wiring layer, is connected to the first-level wiring layer.

In the case where the second-level wiring layer is located as the uppermost layer, a part of the second-level wiring layer constitutes a bonding pad 21. The bonding pad 21 is made of a metal (or metal alloy), as in the case of the second-level wiring layer.

However, in order to prevent the dishing which may occur during the CMP, the bonding pad 21 is formed to have a lattice-like shape. More specifically, in the bonding pad 21, a plurality of dot-like holes which are arranged in a matrix manner are made.

An insulating layer (passivation dielectric) 22 is formed on the insulation layer 27 and the second-level wiring layer. An opening 23 is made in the insulating layer 22 so as to expose the bonding pad 21.

In the semiconductor device manufactured by the dual damascening process, the bonding pad 21 is formed to have a lattice-like shape. Therefore, even in the case where the bonding pad 21 is formed by use of the CMP technique, the necessary portion is not excessively etched, thereby effectively preventing the dishing.

Next, the method of manufacturing a semiconductor device shown in FIGS. 6 and 7 will be described.

First, as can be seen in FIG. 8, with the LOCOS method, a field oxide layer 12 is formed on a silicon substrate 11. After that, in an element region surrounded by the field oxide layer 12, a MOS transistor having a source-drain region 13 and a gate electrode 14 is formed.

Further, as an alternative, an insulating film (borophospho silicate glass (BPSG) or the like) 15 having a thickness of about 1 $\mu$m, which completely covers the MOS transistor, is formed on the silicon substrate 11. The surface of the insulating layer 15 is made flat by the CMP.

Next, as can be seen in FIG. 9, an etching stopper layer 24 and an insulating layer 25 are formed continuously on the insulating film 15 with the CVD method, for example. The insulating layer 25 is made of, for example, silicon oxide. In the case where the insulating layer 25 is made of silicon oxide, the etching stopper layer 24 is made of a material having a high etching selectivity against silicon oxide in reactive ion etching (RIE), that is, for example, silicon nitride.

The thickness of the etching stopper layer 24 is set to about 50 nm, and the thickness of the insulating film 25 is set to the same as that of the wirings which constitute the first-level wiring layer, that is, for example, about 0.6 $\mu$m.

Next, as can be seen in FIG. 10, a plurality of grooves 16b are formed in the insulating layer 25. The plurality of grooves 16b are formed by a photo engraving process, more specifically, the application of a resist on the insulating layer 25, the patterning of the resist, the etching of the insulating layer 25 by RIE using the resist as a mask, and the removal of the resist. The etching stopper layer 24 serves as an etching stopper for the RIE.

It should be noted that the pattern of the plurality of grooves 16b is made to match with the pattern of the wirings which constitute the first-level wiring layer.

Next, as can be seen in FIG. 11, a contact hole 16a is made in the insulating layers 15 and 24. The contact hole 16a is made also by the photo engraving process as in the formation of the plurality of grooves 16b. More specifically, the contact hole 16a is made by applying a resist on the insulating layer 25 and in the grooves 16b, patterning the resist, etching the insulating layers 15 and 24 by the RIE using the resist as a mask, and removing the resist.

Then, as can be seen in FIG. 12, a barrier metal 17a is formed on the insulating layer 25, on an inner surface of the contact hole 16a and the inner surfaces of the grooves 16b, by the CVD method or PVD method. The barrier metal 17a is made of, for example, a lamination of titanium and titanium nitride, or silicon titanium nitride, or the like.

Next, as can be seen in FIG. 13, a metal (or metal alloy) portion 17' which completely covers the contact hole 16a and the grooves 16b, is formed on the barrier metal 17a by the CVD or PVD method. The metal portion 17' is made of, for example, aluminum, copper or an alloy of these metals.

As the PVD method which is used to form the metal portion 17', the high temperature PVD method or a PVD method including such a temperature process that can completely fill the contact holes 16a and the grooves 16b, is used.

Next, as can be seen in FIG. 14, the sections of the barrier metal 17a and the metal portion 17b, which are situated outside the contact holes 16a and the grooves 16b, are etched by the CMP method, so that the barrier metal 17a and the metal portion 17b remain only in the contact holes 16a and the grooves 16b.

In this manner, the first-level wiring layer is formed, and at the same time, a contact plug which serves to electrically connect the first-level wiring layer and the diffusion layer (source-drain region) of the substrate to each other, is formed.

Next, as can be seen in FIG. 15, an insulating layer (for example, silicon oxide) 18 having a thickness of about 1 μm, is formed on the insulating layer 25 and the first-level wiring layer by the CVD method. Further, an etching stopper layer 26 and an insulating layer 27 are formed to be continuous on the insulating film 18 with the CVD method, for example. The insulating layer 27 is made of, for example, silicon oxide. In the case where the insulating layer 27 is made of silicon oxide, the etching stopper layer 26 is made of a material having a high etching selectivity against silicon oxide in reactive ion etching (RIE), that is, for example, silicon nitride.

The thickness of the etching stopper layer 26 is set to about 50 nm, and the thickness of the insulating film 27 is set to the same as that of the wirings which constitute the second-level wiring layer, that is, for example, about 0.6 μm.

Next, as can be seen in FIGS. 16 and 17, a plurality of grooves 19b and 19b' are formed in the insulating layer 25. The plurality of grooves 19b and 19b' are formed by a photo engraving process, more specifically, the application of a resist on the insulating layer 27, the patterning of the resist, the etching of the insulating layer 27 by RIE using the resist as a mask, and the removal of the resist. The etching stopper layer 26 serves as an etching stopper for the RIE.

It should be noted that the pattern of the plurality of grooves 19b and 19b' is made to match with the pattern of the wirings which constitute the second-level wiring layer. The pattern of the grooves 19b' is the same as that of the bonding pad (lattice-like shape) (in the case where the second-level wiring layer is the uppermost layer).

Further, a contact hole 19a is made in the insulating layers 18 and 26. The contact hole 19a is made also by the photo engraving process as in the formation of the plurality of grooves 19b and 19b'. More specifically, the contact hole 19a is made by applying a resist on the insulating layer 27 and in the grooves 19b and 19b', patterning the resist, etching the insulating layers 18 and 26 by the RIE using the resist as a mask, and removing the resist.

After that, as can be seen in FIGS. 18 and 19, a barrier metal 20a is formed on the insulating layer 27, on an inner surface of the contact hole 19a and the inner surfaces of the grooves 19b and 19b', by the CVD method or PVD method. The barrier metal 20a is made of, for example, a lamination of titanium and titanium nitride, or silicon titanium nitride, or the like.

Further, metal (or metal alloy) portions 20b and 21 which completely cover the contact hole 19a and the grooves 19b and 19b', are formed on the barrier metal 20a by the CVD or PVD method. The metal portions 20b and 21 are made of, for example, aluminum, copper or an alloy of these metals.

As the PVD method which is used to form the metal portions 20b and 21, the high temperature PVD method or a PVD method including such a temperature process that can completely fill the contact hole 19a and the grooves 19b and 19b', is used.

After that, the sections of the barrier metal 20a and the metal portions 20b and 21, which are situated outside the contact hole 19a and the grooves 19b and 19b', are etched by the CMP method, so that the barrier metal 20a and the metal portions 20b and 21 remain only in the contact hole 19a and the grooves 19b and 19b'.

In this manner, the second-level wiring layer and the bonding pad having a lattice-like shape are formed, and at the same time, a contact plug which serves to electrically connect the first-level wiring layer and the second-level wiring layer to each other, is formed.

Next, as can be seen in FIG. 20, a passivation layer 22 is formed on the insulating layer 27, the second-level wiring layer and the bonding pad, by, for example, the CVD method. The passivation layer 22 is made of, for example, silicon oxide.

Next, as can be seen in FIGS. 21 and 22, an opening 23 is formed in the passivation layer 22. The opening 23 is situated so as to the lattice-shaped bonding pad 21, and is formed by a photo engraving process, more specifically, the application of a resist on the insulating layer 22, the patterning of the resist, the etching of the insulating layer 22 by RIE using the resist as a mask, and the removal of the resist.

In the RIE operation for making the opening 23, usually the insulating layer 27 is etched as well since the insulating layers 22 and 27 are made of the same material (for example, silicon oxide).

The feature of the semiconductor device manufactured by the above-described dual damascening process or damascening process is that the metal portion itself which gives rise to wirings is not patterned, but the insulating layer is patterned. Since there is no process for filling the sections between wirings with the insulating layer, no cavities are formed between wirings.

Further, in some cases, copper, which has a low resistance, is used to form wirings; however it is known to be very difficult to perform a patterning on copper. In the dual damascening process or damascening process, the patterning of copper is not carried out, but the wirings are formed by filling grooves of an insulating layer with copper. Thus, the wirings made of copper are realized.

Further, in the dual damascening process, wirings and contact plugs can be formed at the same time, and therefore the production cost can be reduced.

However, in the dual damascening process, the RIE operated to make the opening 23 to expose the bonding pad 21, inevitably serves to etch the insulating layer 27 at the same time. This is because the insulating layers 22 and 27 are made of the same material (for example, silicon oxide) as described above.

In the above-described case, as shown in FIGS. 23 and 24, a wire bonding operation can easily result in that a wire 28 squash the lattice-shaped bonding pad 21, which may cause a bonding error. This is because portions of the lattice-like bonding pad 21 are cavities, which may easily cause the deformation of the bonding pad 21.

BRIEF SUMMARY OF THE INVENTION

The present invention has been proposed as a solution to the above-described drawback of the conventional technique, and the object thereof is as follows. That is, regarding the semiconductor device manufactured by the dual damascening process or damascening process, the bonding pad is formed to have a lattice shape, and the deformation of the lattice-shaped bonding pad is prevented so as to suppress bonding error, thereby improving the reliability and yield of the product.

In order to achieve the above-described object, there is provided, according to the present invention, a semiconductor device including: a bonding pad constituted by a conductive member filled in grooves made in an insulating layer having a flat surface; an etching stopper layer formed on the insulating layer and having an opening to expose the bonding pad; and a passivation layer formed on the etching stopper layer and having an opening to expose the bonding pad.

The grooves of the insulating layer are arranged in a lattice-like shape and the bonding pad has a lattice-like shape. The insulating layer and the passivation layer are made of silicon oxide, and the etching stopper layer is made of silicon nitride.

Further, according to the present invention, there is provided a method of manufacturing a semiconductor device, in which a bonding pad is formed by making grooves in an insulating layer having a flat surface and filling the grooves with a conductive material, the method including the stops of: forming an etching stopper layer on the insulating layer and the bonding pad, the etching stopper layer being made of a material which can be etched selectively with respect to at least a material which is used to form the insulating layer; forming a passivation layer on the etching stopper layer, the passivation layer being made of a material which can be etched selectively with respect to at least the material used to form the etching stopper layer; removing only a portion of the passivation layer, which is situated above the bonding pad; and removing only a portion of the etching stopper layer, which is situated above the bonding pad.

The bonding pad is formed by forming a conductive material layer which completely covers the grooves on the insulating layer, followed by polishing the conductive material layer by the CMP. The passivation layer is etched by the RIE and the etching stopper layer is etched by the RIE or CDE.

As the grooves are filled with the conductive material, the bonding pad and the uppermost wiring layer are formed at the same time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIG. 8 is a cross sectional view of a device, which illustrate a step of a manufacturing method;

FIG. 9 is a cross sectional view of a device, which illustrate another step of the manufacturing method;

FIG. 10 is a cross sectional view of a device, which illustrate still another step of the manufacturing method;

FIG. 11 is a cross sectional view of a device, which illustrate still another step of the manufacturing method;

FIG. 12 is a cross sectional view of a device, which illustrate still another step of the manufacturing method;

FIG. 13 is a cross sectional view of a device, which illustrate still another step of the manufacturing method;

FIG. 21 is a plan view of a device, which illustrates a step of the manufacturing method;

FIG. 22 is a cross sectional view taken along the line XXII—XXII indicated in FIG. 21;

FIG. 23 is a plan view which illustrates a state in which wire bonding is carried out on the device shown in FIG. 6;

FIG. 24 is a cross sectional view taken along the line XXIV—XXIV indicated in FIG. 23;

FIG. 30 is a cross sectional view of a device, which illustrates still another step of a manufacturing method according to the embodiment of the present invention;

FIG. 31 is a cross sectional view of a device, which illustrates still another step of a manufacturing method according to the embodiment of the present invention;

FIG. 32 is a cross sectional view of a device, which illustrates still another step of a manufacturing method according to the embodiment of the present invention;

FIG. 33 is a cross sectional view of a device, which illustrates still another step of a manufacturing method according to the embodiment of the present invention;

FIG. 34 is a cross sectional view of a device, which illustrates still another step of a manufacturing method according to the embodiment of the present invention;

FIG. 39 is a cross sectional view of a device, which illustrates a step of a manufacturing method according to an embodiment of the present invention;

FIG. 44 is a plan view which illustrates a state in which wire bonding is carried out on the device shown in FIG. 25; and FIG. 45 is a cross sectional view taken along the line XLV—XLV indicated in FIG. 44.

DETAILED DESCRIPTION OF THE INVENTION

Semiconductor devices of the present invention and methods of manufacturing the same will now be described in detail with reference to embodiments thereof shown in accompanying drawings.

Figure 1:
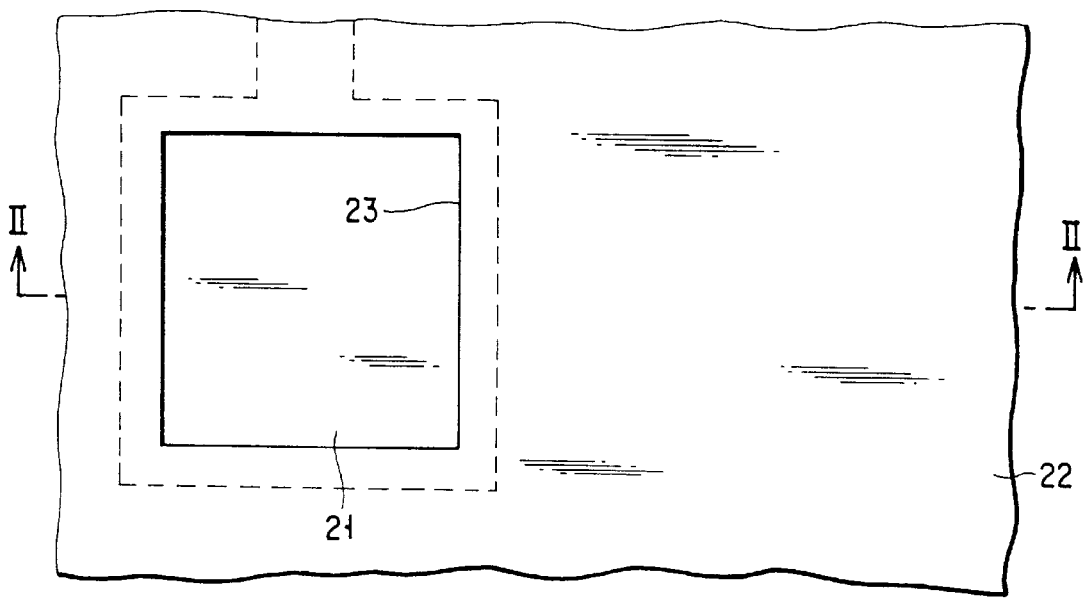
FIG. 1 is a plan view showing a conventional semiconductor device.
Figure 2:
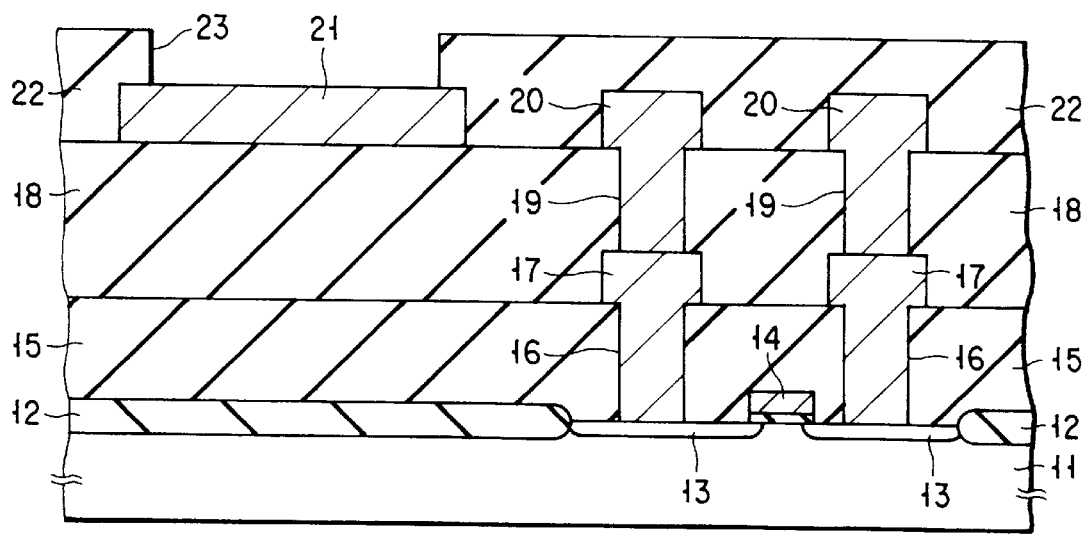
FIG. 2 is a cross sectional view taken along the line II—II indicated in FIG. 1.
Figure 3:
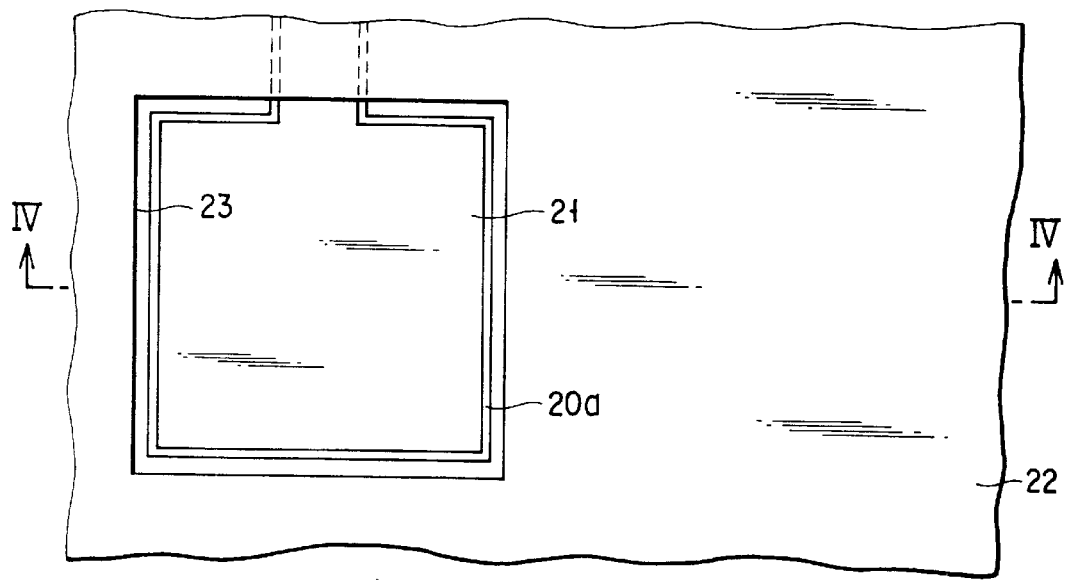
FIG. 3 is a plan view showing a conventional semiconductor device.
Figure 4:
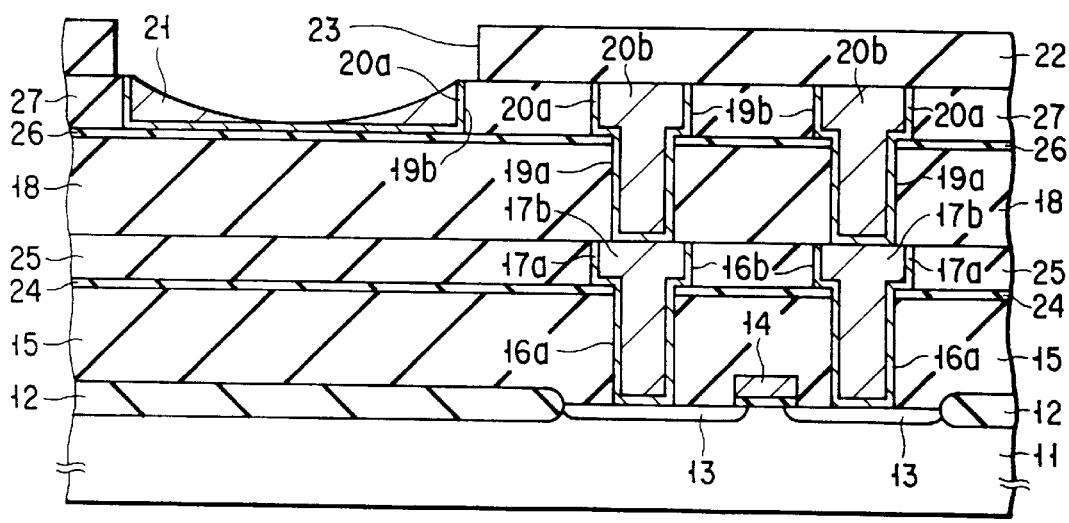
FIG. 4 is a cross sectional view taken along the line IV—IV indicated in FIG. 3.
Figure 5:
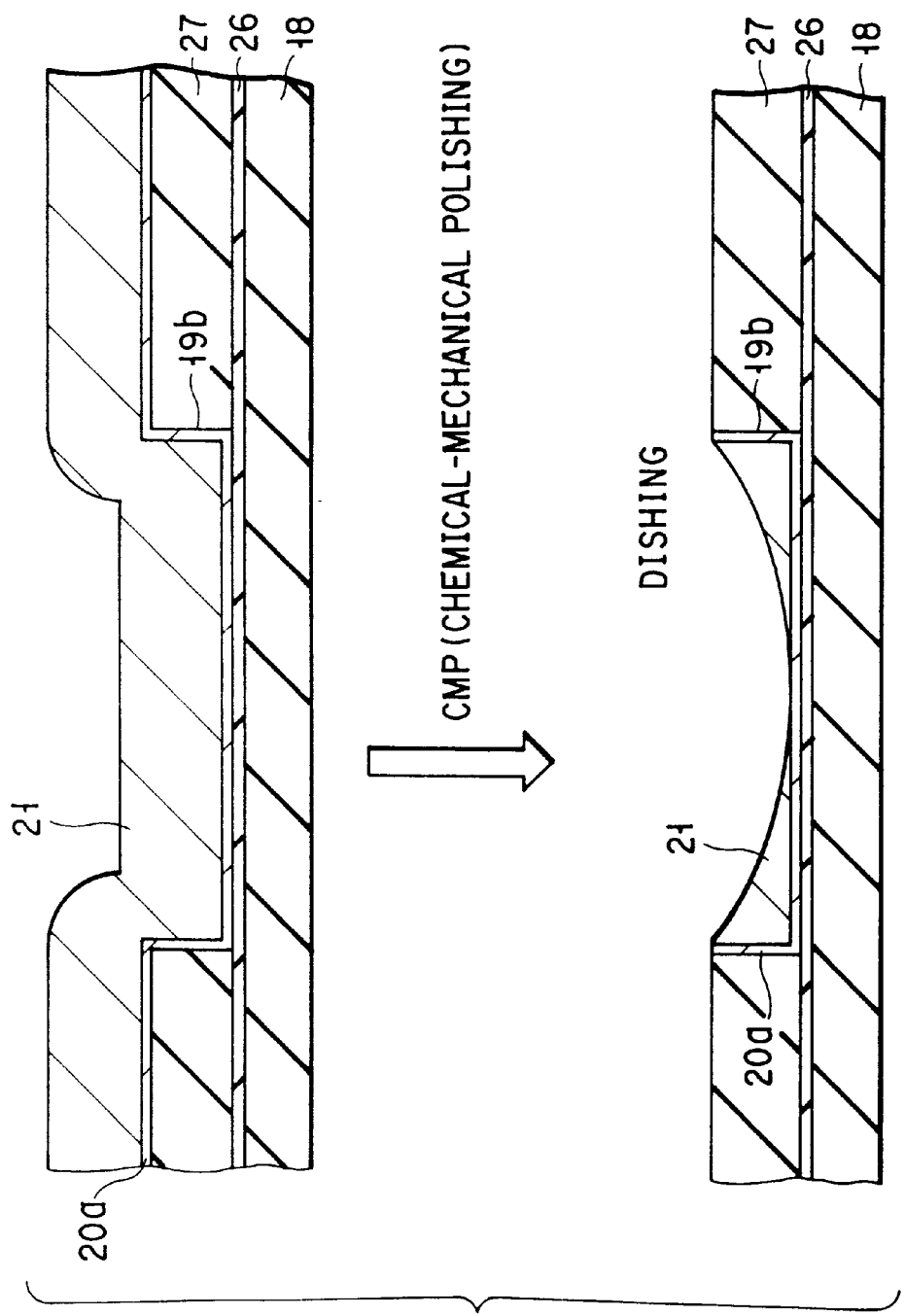
FIG. 5 is a diagram showing a dishing phenomenon which may occur in conventional damascening process.
Figure 6:
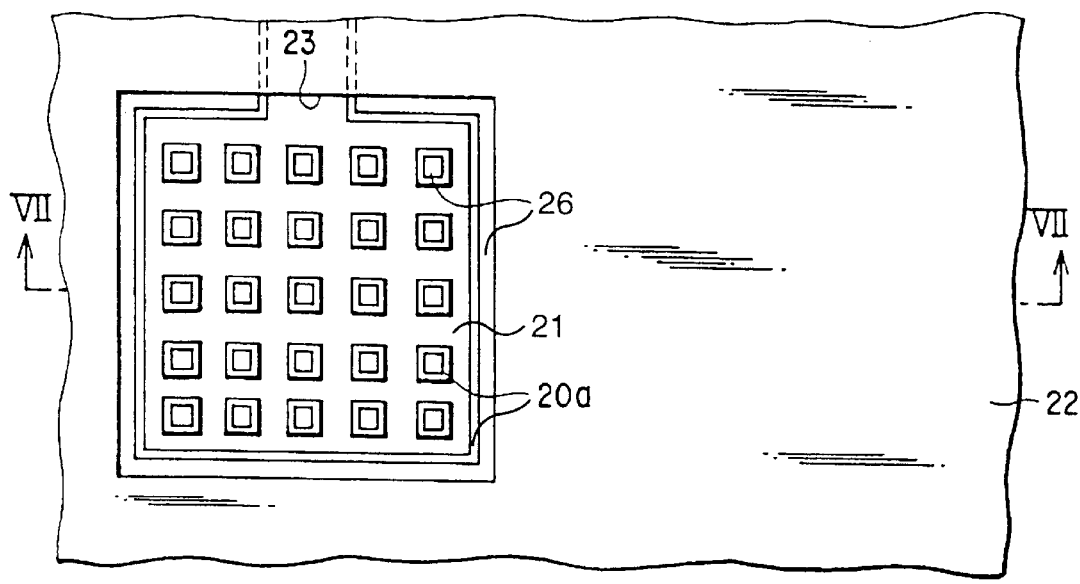
FIG. 6 is a plan view showing a semiconductor device.
Figure 7:
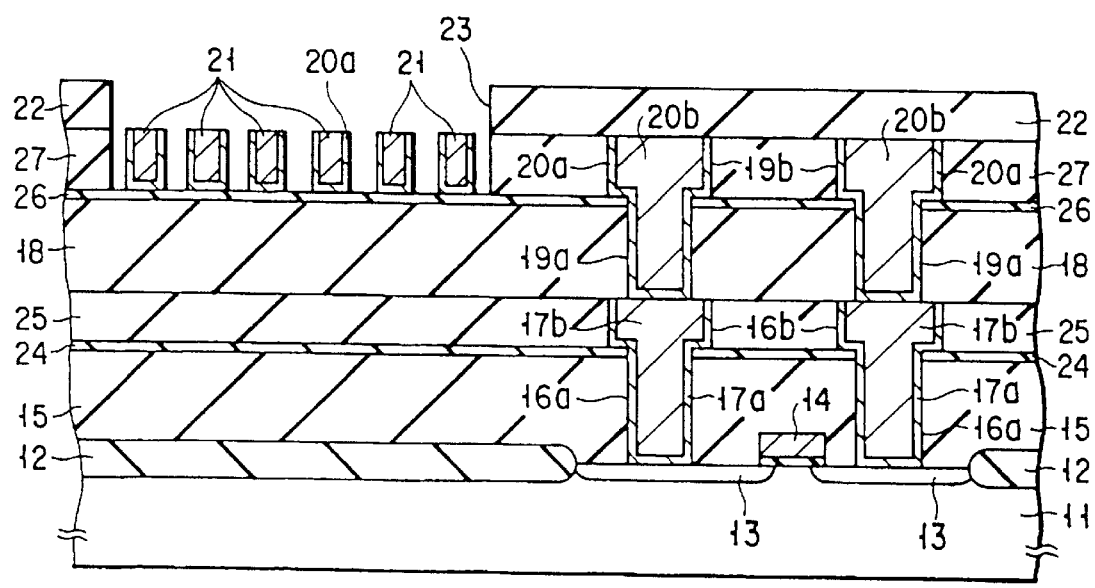
FIG. 7 is a cross sectional view taken along the line VII—VII indicated in FIG. 6.
Figure 14:
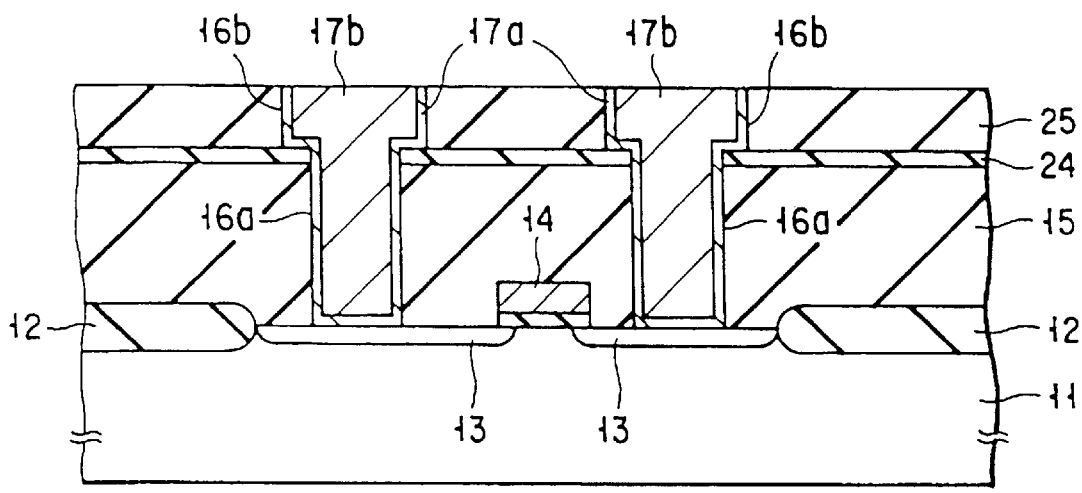
FIG. 14 is a cross sectional view of a device, which illustrate still another step of the manufacturing method.
Figure 15:
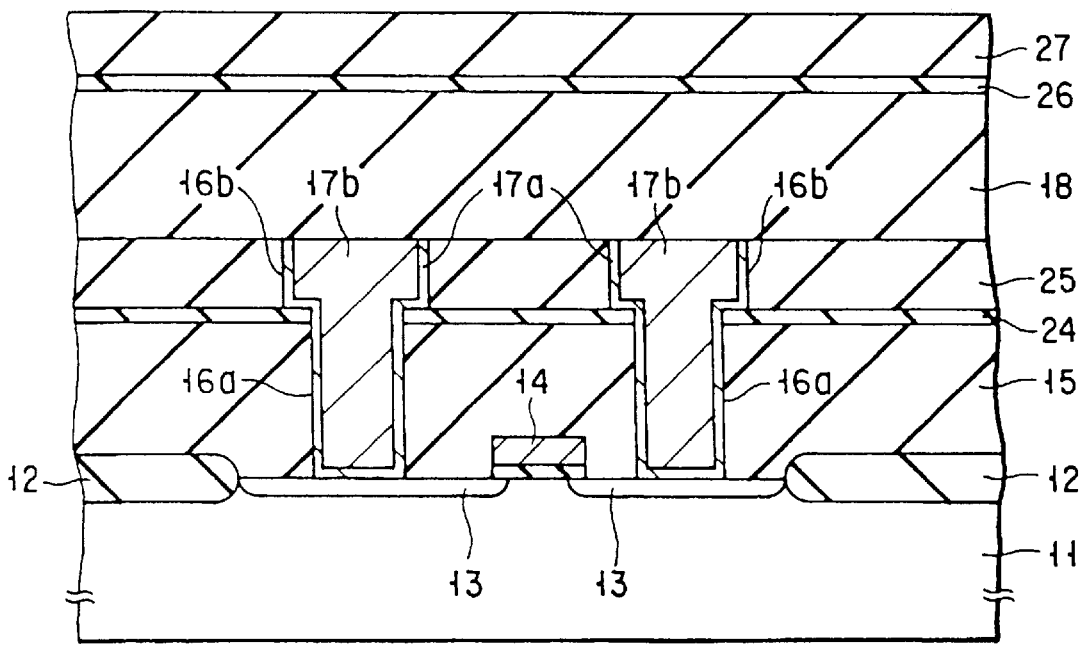
FIG. 15 is a cross sectional view of a device, which illustrate still another step of the manufacturing method.
Figure 16:
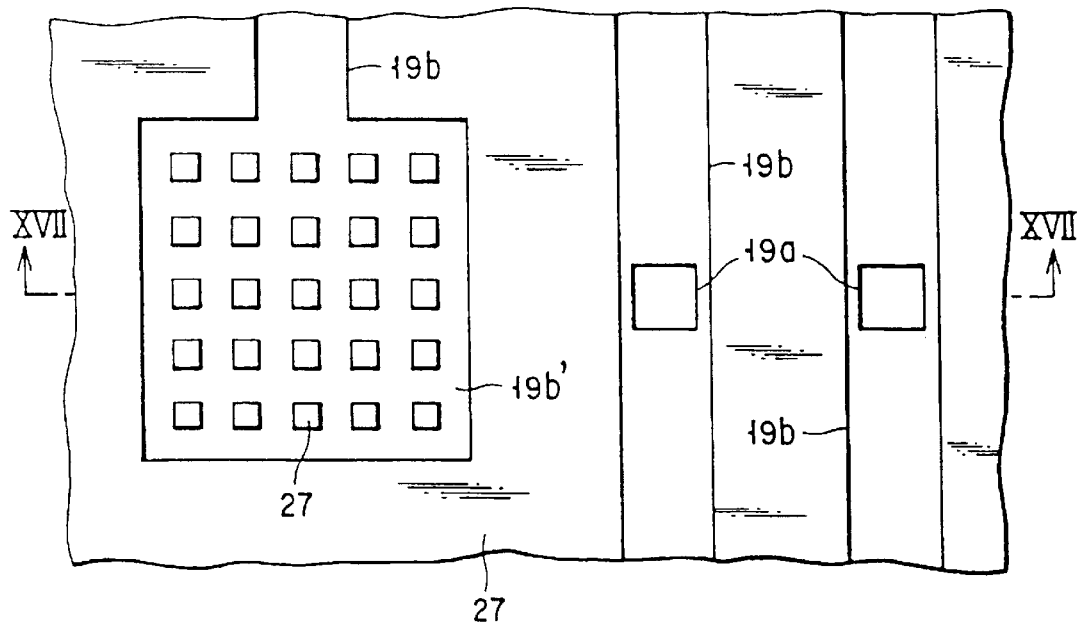
FIG. 16 is a plan view of a device, which illustrates a step of the manufacturing method.
Figure 17:
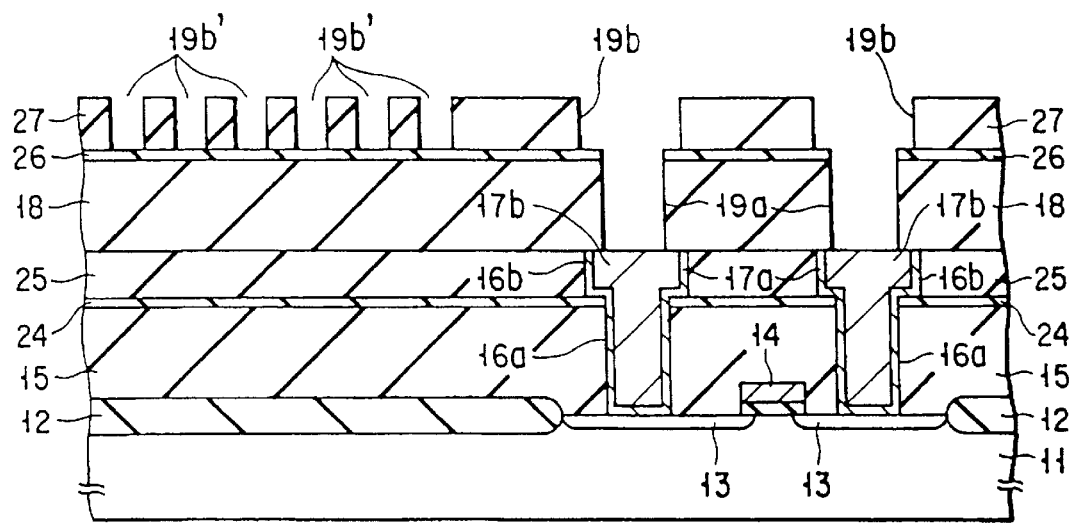
FIG. 17 is a cross sectional view taken along the line XVII—XVII indicated in FIG. 16.
Figure 18:
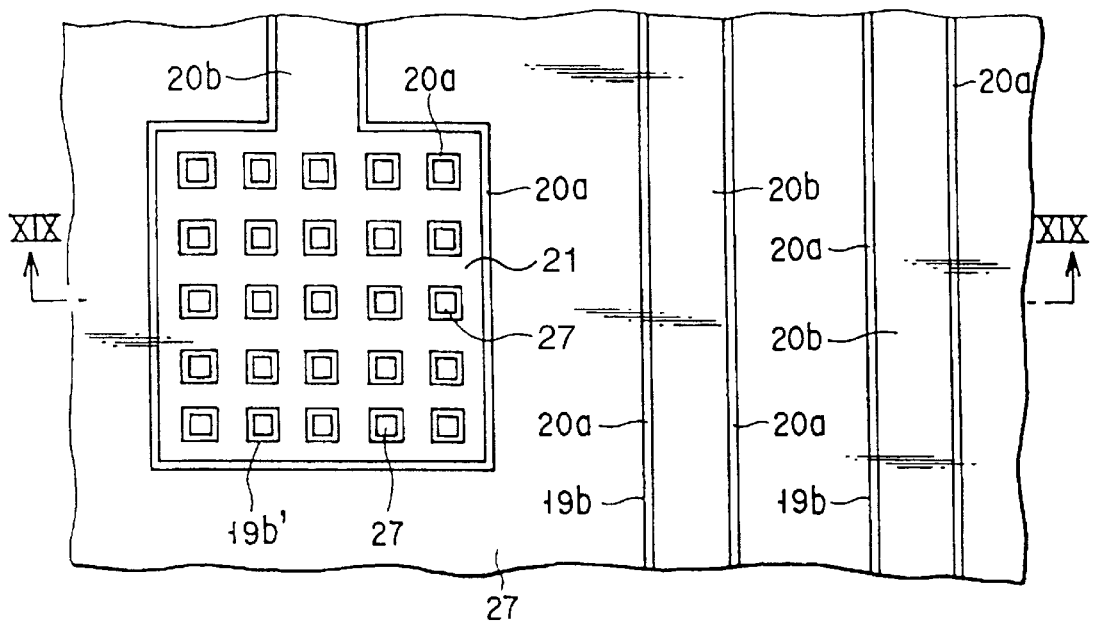
FIG. 18 is a plan view of a device, which illustrates a step of the manufacturing method.
Figure 19:
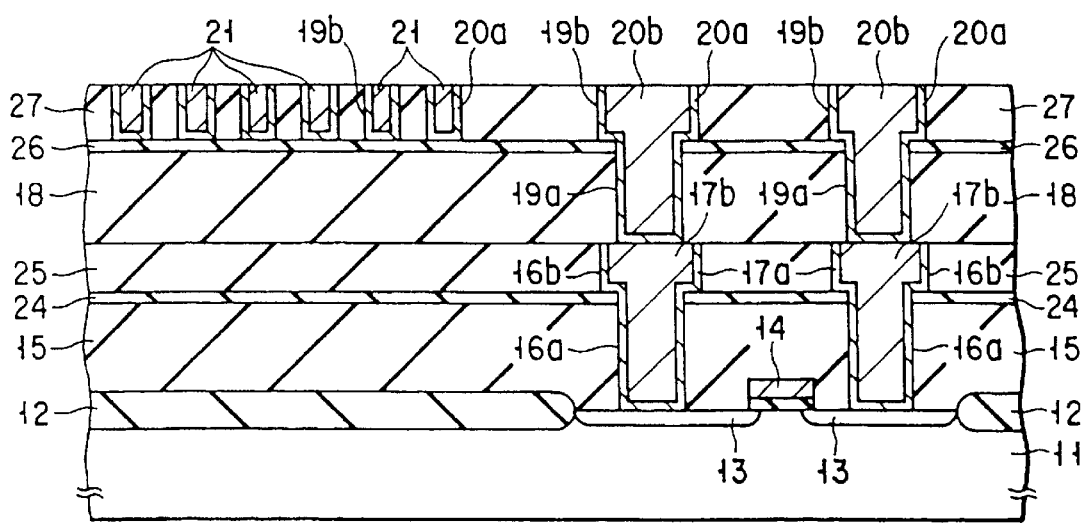
FIG. 19 is a cross sectional view taken along the line XIX—XIX indicated in FIG. 18.
Figure 20:
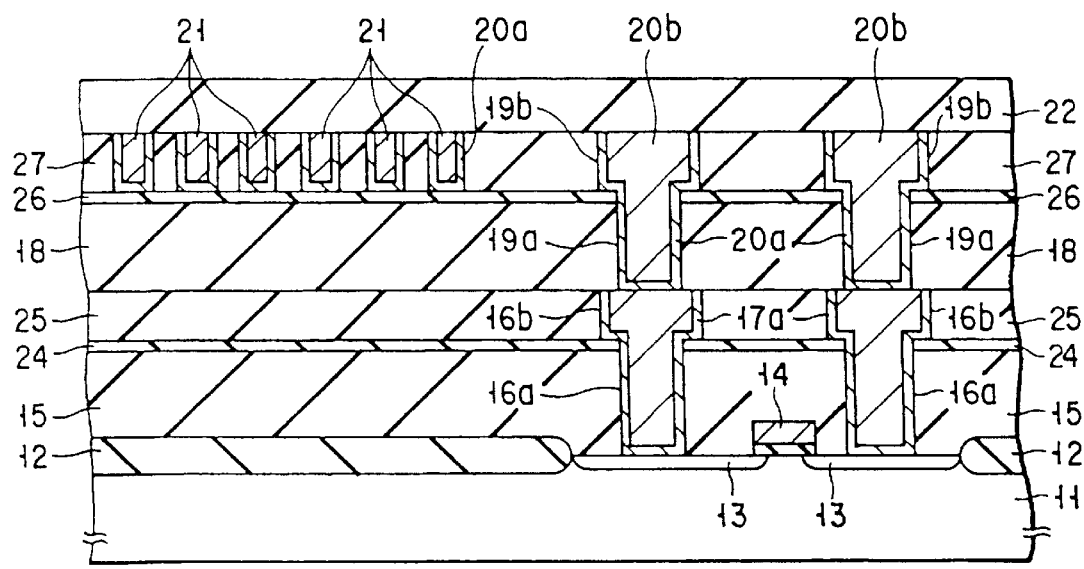
FIG. 20 is a cross sectional view of a device, which illustrates a step of the manufacturing method.
Figure 25:
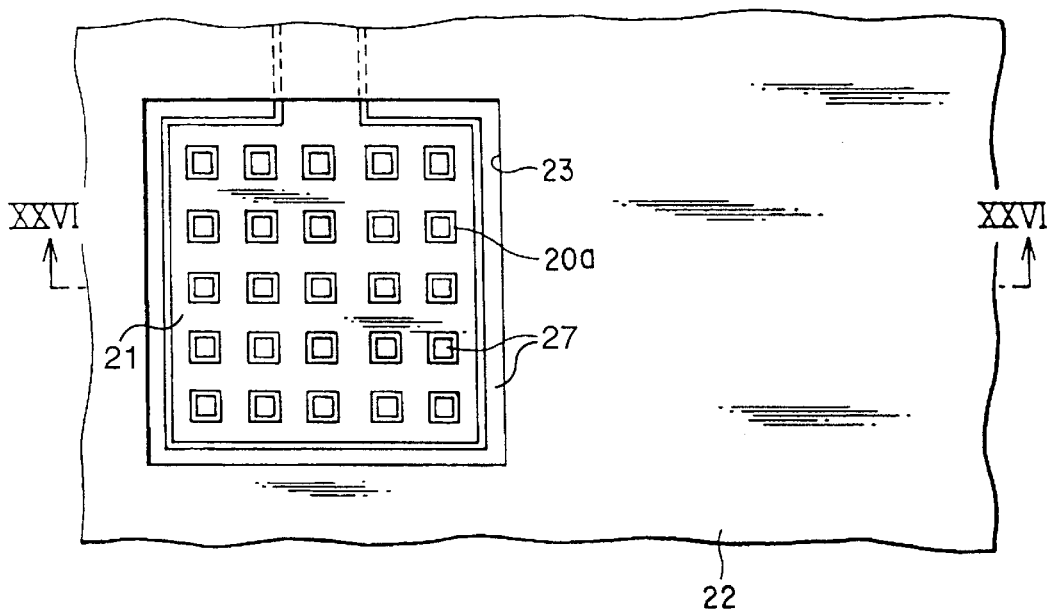
FIG. 25 is a plan view of a semiconductor device according to an embodiment of the present invention.
Figure 26:
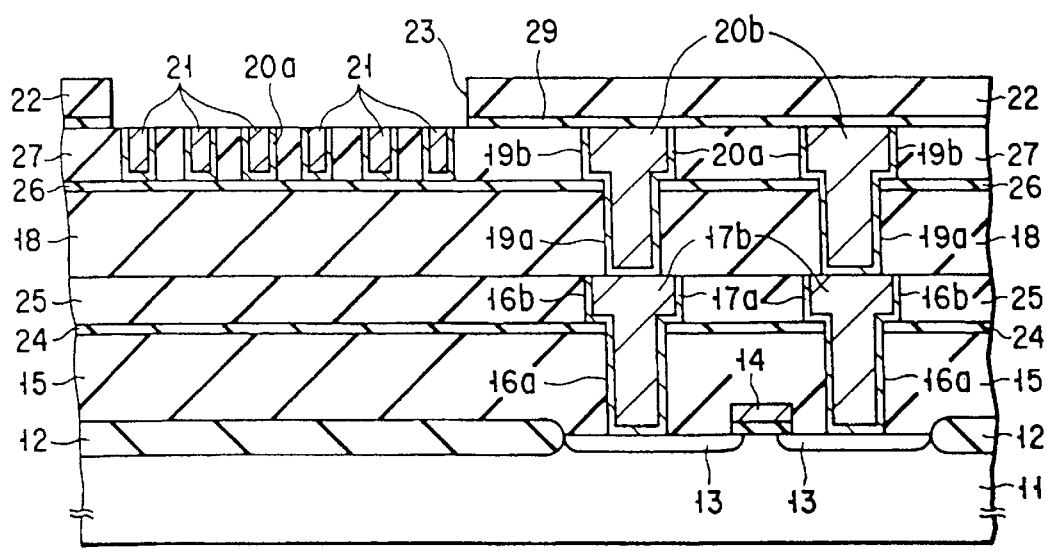
FIG. 26 is a cross sectional view taken along the line XXVI—XXVI indicated in FIG. 25.

FIGS. 25 and 26 show a semiconductor device formed by the dual damascening process according to an embodiment of the present invention. FIG. 26 is a cross sectional view taken along the line XXVI—XXVI indicated in FIG. 25.

As can be seen in the figure, a field oxide layer 12 is formed on a semiconductor substrate 11. In an element region surrounded by the field oxide layer 12, a MOS transistor having a source-drain region 13 and a gate electrode 14, is formed.

On the semiconductor substrate 11, insulating layers 15 and 24 are formed so as to completely cover the MOS transistor. A contact hole 16a is made in the insulating layers 15 and 24 from its surface to be through to the source-drain region 13.

The insulating layer 25 is formed on the insulating layer 24. In the insulating layer 25, a plurality of grooves 16b used for forming a first-level wiring layer, are formed. Bottom sections of the plurality of grooves 16b are made through to the contact hole 16a.

A barrier metal 17a is formed on an inner surface of each of the contact hole 16a and the grooves 16. Further, on each of the barrier metals 17a, a metal (or metal alloy) portion 17b is formed so as to completely fill each of the contact hole 16a and the grooves 16b. The plurality of wirings which make the first level wiring layer, consist of the barrier metals 17a and the metal portions 17b.

A contact plug used for connecting the first level wiring layer and the source-drain region 13 of the MOS transistor to each other, also consists of the barrier metal 17a and the metal portion 17b. The surface of the insulating layer 25 meets with that of the first-level wiring layer, and the surface is made flat.

On the insulating layer 25 and the first level wiring layer, the insulating layer (interlayer dielectric) 18 and the insulating layer 26 are formed. A contact hole 19a is formed in the insulating layers 18 and 26 from its surface to be through to the first-level wiring layer.

An insulating layer 27 is formed on the insulating film 26. A plurality of grooves 19b used for forming the second-level wiring layer, are formed in the insulating layer 27. Bottom sections of the plurality of grooves 19b are made through to the contact hole 19a.

A barrier metal 20a is formed on an inner surface of each of the contact hole 19a and the grooves 19b. Further, on each of the barrier metals 20a, a metal (or metal alloy) portion 20b is formed so as to completely fill each of the contact hole 19a and the grooves 19b. The plurality of wirings which make the second level wiring layer, consist of the barrier metals 20a and the metal portions 20b.

A contact plug used for connecting the first-level wiring layer and the second-level wiring layer to each other, also consists of the barrier metal 20a and the metal portion 20b. The surface of the insulating layer 27 meets with that of the second-level wiring layer, and the surface is made flat.

In the case where the second-level wiring layer is located as the uppermost layer, a part of the second-level wiring layer constitutes a bonding pad 21. The bonding pad 21 is made of a metal (or metal alloy), as in the case of the second-level wiring layer. However, in order to prevent the dishing which may occur during the CMP, the bonding pad 21 is formed to have, for example, a lattice-like shape.

Further, an etching stopper layer 29 is formed on the insulating layer 27 and the second-level wiring layer, and a passivation layer (passivation dielectric) 22 is formed on the etching stopper layer 29.

The etching stopper layer 29 is made of a material which can be etched selectively with respect to the material used for the insulating layer 27 and the passivation layer 22. For example, in the case where the insulating layer 27 and the passivation layer 22 are made of silicon oxide, the etching stopper layer 29 is made of silicon nitride. The etching stopper layer 29 is formed to have a thickness of about 50 nm.

An opening 23 is made in the passivation layer 22 and the etching stopper layer 29 so as to expose the bonding pad 21.

In the semiconductor device manufactured by the dual damascening process, the bonding pad 21 is formed to have a lattice-like shape. Therefore, even in the case where the bonding pad 21 is formed by use of the CMP technique, the necessary portion thereof is not excessively etched, thereby effectively preventing the dishing.

Further, the bonding pad 21 having a lattice shape is completely filled with the insulating layer 27. With this structure, the bonding pad 21 is not squashed or deformed when the wire is bonded thereto by compression by wire bonding. Therefore, the occurrence of bonding errors is suppressed, thus contributing the improvement of the reliability and the yield of the product.

Furthermore, directly underneath the passivation layer 22, the etching stopper layer 29 is located, which is made of a material which can be etched selectively with respect to the material used for forming the passivation layer 22 and the insulating layer 27. With this structure, the portions of the insulating layer 27, which are situated in the lattice-like formations of the bonding pad 21, are not etched when the opening 23 is made in the passivation layer 22.

Next, the method of manufacturing a semiconductor device shown in FIGS. 25 and 26 will be described.

Figure 27:
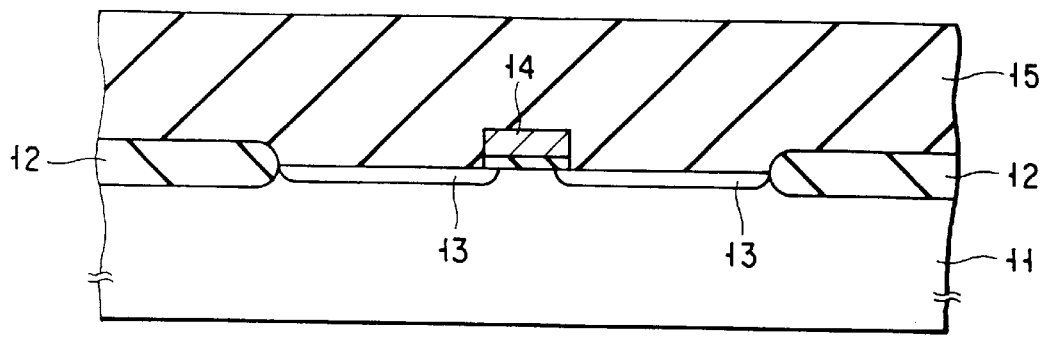
FIG. 27 is a cross sectional view of a device, which illustrates a step of a manufacturing method according to an embodiment of the present invention.

First, as can be seen in FIG. 27, with the LOCOS method, a field oxide layer 12 is formed on a silicon substrate 11. After that, in an element region surrounded by the field oxide layer 12, a MOS transistor having a source-drain region 13 and a gate electrode 14 is formed.

Further, as an alternative, an insulating film (borophospho silicate glass (BPSG) or the like) 15 having a thickness of about 1 $\mu$m, which completely covers the MOS transistor, is formed on the silicon substrate 11. The surface of the insulating layer 15 is made flat by the CMP.

Figure 28:
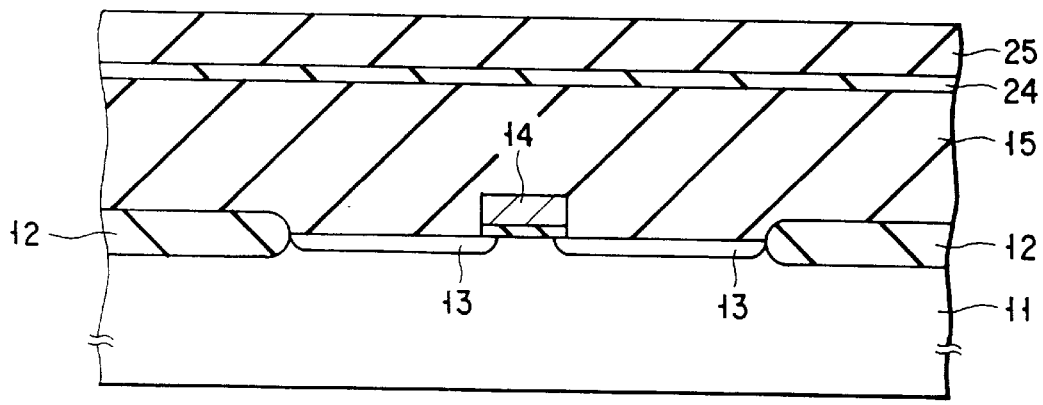
FIG. 28 is a cross sectional view of a device, which illustrates another step of a manufacturing method according to the embodiment of the present invention.

Next, as can be seen in FIG. 28, an etching stopper layer 24 and an insulating layer 25 are formed continuously on the insulating film 15 with the CVD method, for example. The insulating layer 25 is made of, for example, silicon oxide. In the case where the insulating layer 25 is made of silicon oxide, the etching stopper layer 24 is made of a material having a high etching selectivity against silicon oxide in reactive ion etching (RIE), that is, for example, silicon nitride.

The thickness of the etching stopper layer 24 is set to about 50 nm, and the thickness of the insulating film 25 is set to the same as that of the wirings which constitute the first-level wiring layer, that is, for example, about 0.6 $\mu$m.

Figure 29:
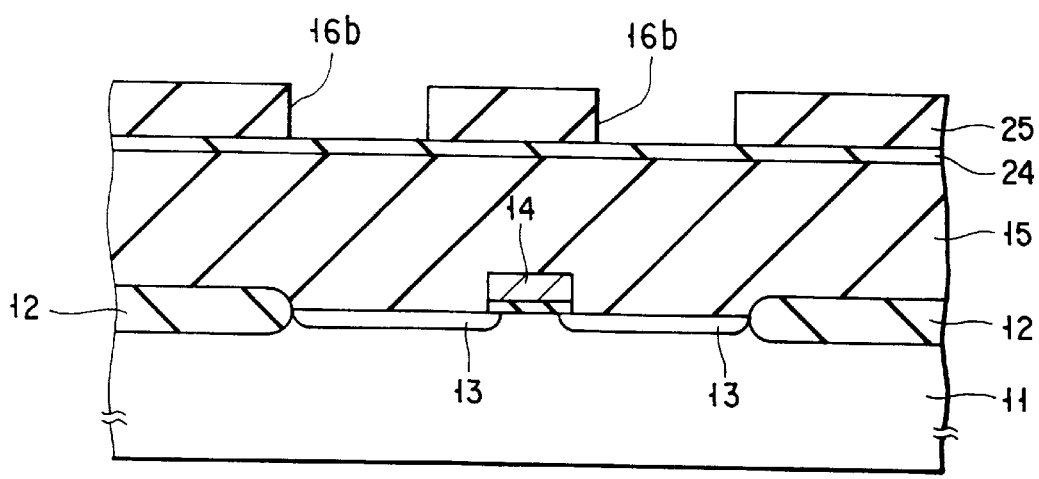
FIG. 29 is a cross sectional view of a device, which illustrates still another step of a manufacturing method according to the embodiment of the present invention.

Next, as can be seen in FIG. 29, a plurality of grooves 16b are formed in the insulating layer 25. The plurality of grooves 16b are formed by a photo engraving process, more specifically, the application of a resist on the insulating layer 25, the patterning of the resist, the etching of the insulating layer 25 by RIE using the resist as a mask, and the removal of the resist. The etching stopper layer 24 serves as an etching stopper for the RIE.

It should be noted that the pattern of the plurality of grooves 16b is made to match with the pattern of the wirings which constitute the first-level wiring layer.

Next, as can be seen in FIG. 30, a contact hole 16a is made in the insulating layers 15 and 24. The contact hole 16a is made also by the photo engraving process as in the formation of the plurality of grooves 16b. More specifically, the contact hole 16a is made by applying a resist on the insulating layer 25 and in the grooves 16b, patterning the resist, etching the insulating layers 15 and 24 by the RIE using the resist as a mask, and removing the resist.

Then, as can be seen in FIG. 31, a barrier metal 17a is formed on the insulating layer 25, on an inner surface of the contact hole 16a and the inner surfaces of the grooves 16b, by the CVD method or PVD method. The barrier metal 17a is made of, for examples a lamination of titanium and titanium nitride, or silicon titanium nitride, or the like.

Next, as can be seen in FIG. 32, a metal (or metal alloy) portion 17' which completely covers the contact hole 16a and the grooves 16b, is formed on the barrier metal 17a by the CVD or PVD method. The metal portion 17' is made of, for example, aluminum, copper or an alloy of these metals.

As the PVD method which is used to form the metal portion 17', the high temperature PVD method or a PVD method including such a temperature process that can completely fill the contact holes 16a and the grooves 16b, is used.

Next, as can be seen in FIG. 33, the sections of the barrier metal 17a and the metal portion 17b, which are situated outside the contact holes 16a and the grooves 16b, are etched by the CMP method, so that the barrier metal 17a and the metal portion 17b remain only in the contact holes 16a and the grooves 16b.

In this manner, the first-level wiring layer is formed, and at the same time, a contact plug which serves to electrically connect the first-level wiring layer and the diffusion layer (source-drain region) of the substrate to each other, is formed.

Next, as can be seen in FIG. 34, an insulating layer (for example, silicon oxide) 18 having a thickness of about 1 $\mu$m, is formed on the insulating layer 25 and the first-level wiring layer by the CVD method. Further, an etching stopper layer 26 and an insulating layer 27 are formed to be continuous on the insulating film 18 with the CVD method, for example. The insulating layer 27 is made of, for example, silicon oxide. In the case where the insulating layer 27 is made of silicon oxide, the etching stopper layer 26 is made of a material having a high etching selectivity against silicon oxide in reactive ion etching (RIE), that is, for example, silicon nitride.

The thickness of the etching stopper layer 26 is set to about 50 nm, and the thickness of the insulating film 27 is set to the same as that of the wirings which constitute the second-level wiring layer.

Figure 35:
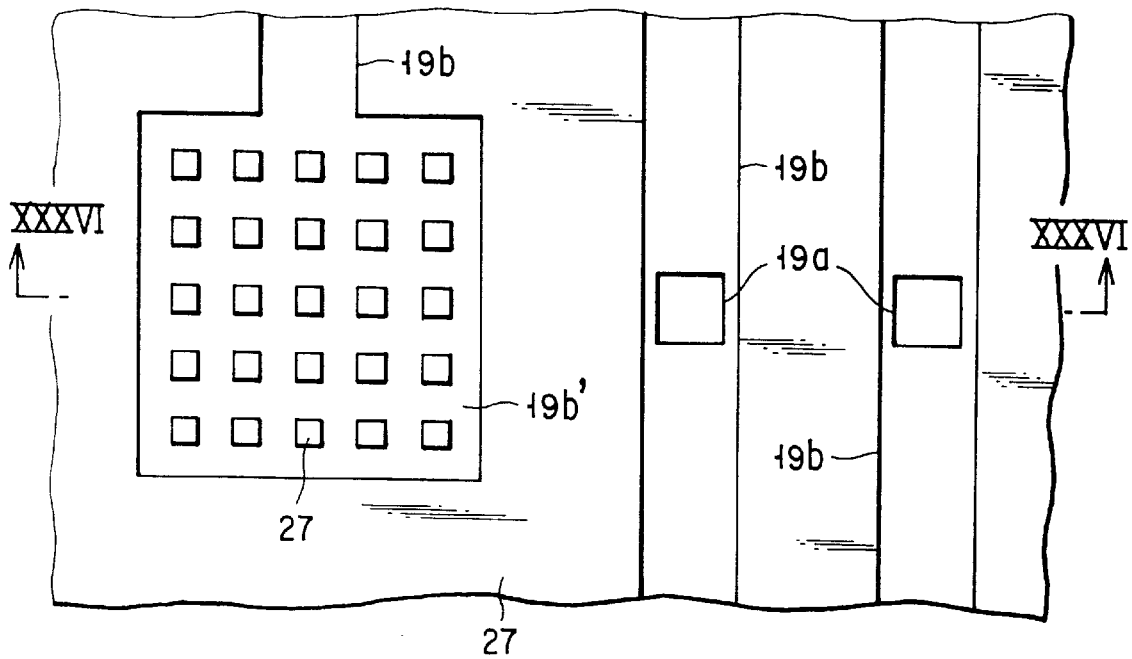
FIG. 35 is a plan view of a device, which illustrates a step of a manufacturing method according to an embodiment of the present invention.
Figure 36:
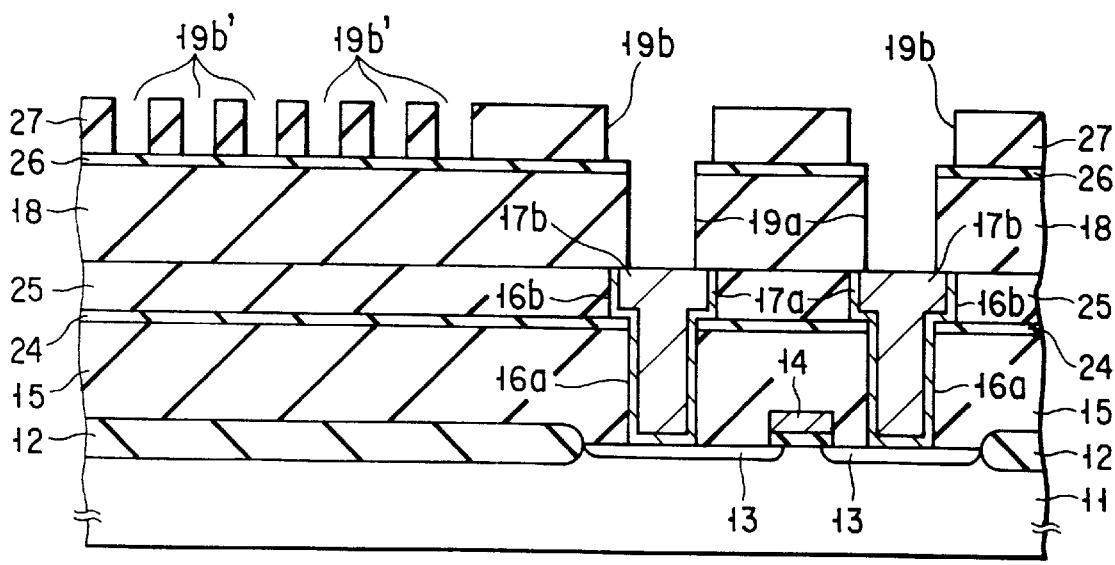
FIG. 36 is a cross sectional view taken along the line XXXVI—XXXVI indicated in FIG. 35.

Next, as can be seen in FIGS. 35 and 36, a plurality of grooves 19b and 19b' are formed in the insulating layer 25. The plurality of grooves 19b and 19b' are formed by a photo engraving process, more specifically, the application of a resist on the insulating layer 27, the patterning of the resist, the etching of the insulating layer 27 by RIE using the resist as a mask, and the removal of the resist. The etching stopper layer 26 serves as an etching stopper for the RIE.

It should be noted that the pattern of the plurality of grooves 19b and 19b' is made to match with the pattern of the wirings which constitute the second-level wiring layer. The pattern of the grooves 19b' is the same as that of the bonding pad (lattice-like shape) (in the case where the second-level wiring layer is the uppermost layer).

Figure 37:
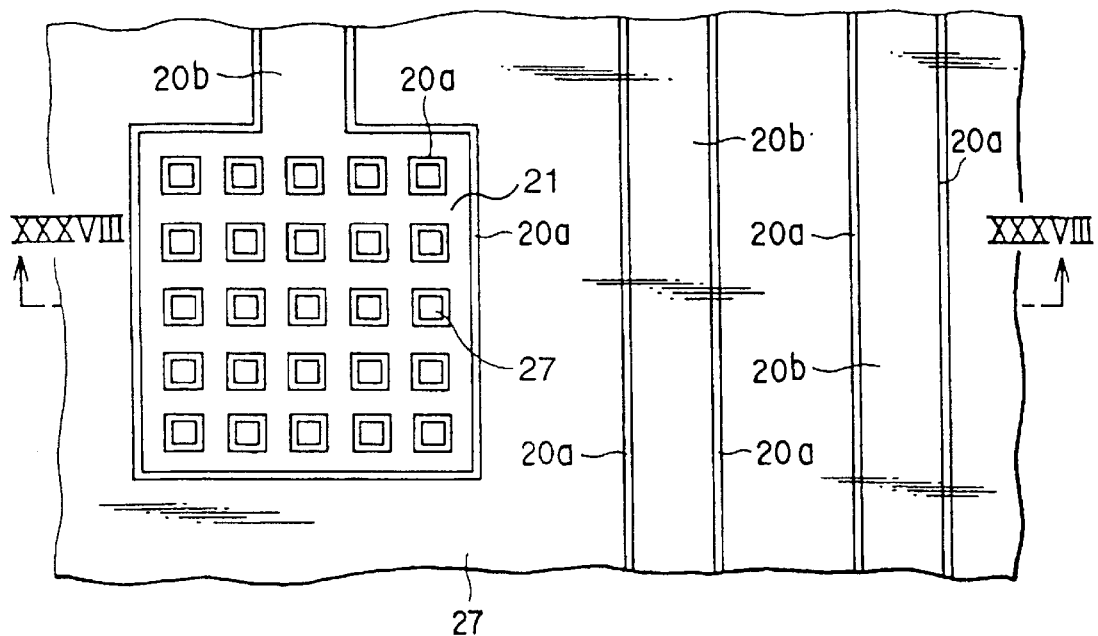
FIG. 37 is a plan view of a device, which illustrates a step of a manufacturing method according to an embodiment of the present invention.
Figure 38:
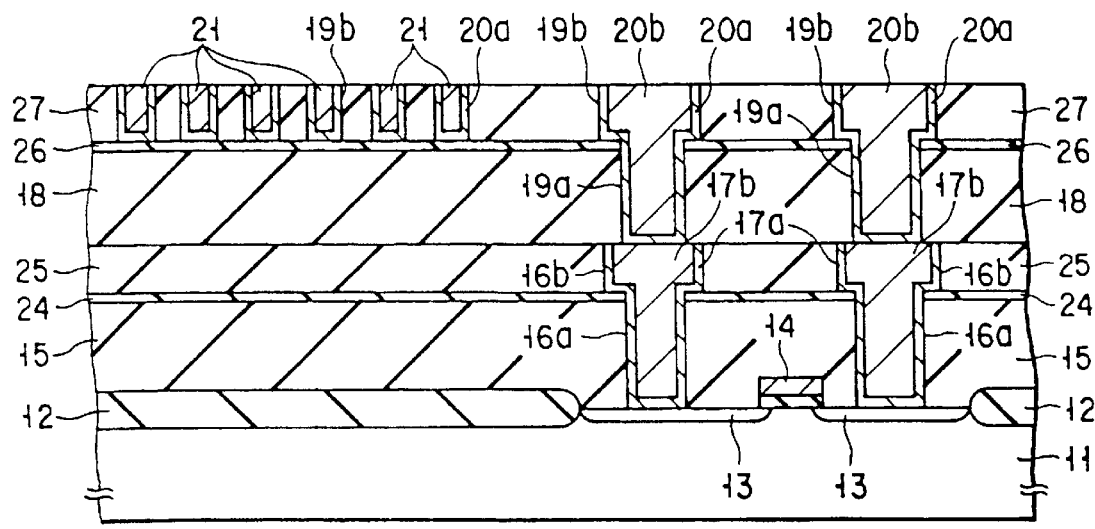
FIG. 38 is a cross sectional view taken along the line XXXVIII—XXXVIII indicated in FIG. 37.

Next, as can be seen in FIGS. 37 and 38, a contact hole 19a is made in the insulating layers 18 and 26. The contact hole 16a is made also by the photo engraving process as in the formation of the plurality of grooves 19b and 19b'. More specifically, the contact hole 19a is made by applying a resist on the insulating layer 27 and in the grooves 19b and 19b', patterning the resist, etching the insulating layers 18 and 26 by the RIE using the resist as a mask, and removing the resist.

After that, a barrier metal 20a is formed on the insulating layer 27, on an inner surface of the contact hole 19a and the inner surfaces of the grooves 19b and 19b', by the CVD method or PVD method. The barrier metal 20a is made of, for example, a lamination of titanium and titanium nitride, or silicon titanium nitride, or the like.

Next, metal (or metal alloy) portions 20b and 21 which completely cover the contact hole 19a and the grooves 19b and 19b', are formed on the barrier metal 20a by the CVD or PVD method. The metal portions 20b and 21 are made of, for example, aluminum, copper or an alloy of these metals.

As the PVD method which is used to form the metal portions 20b and 21, the high temperature PVD method or a PVD method including such a temperature process that can completely fill the contact hole 16a and the grooves 19b and 19b', is used.

Next, the sections of the barrier metal 20a and the metal portions 20b and 21, which are situated outside the contact hole 19a and the grooves 19b and 19b', are etched by the CMP method, so that the barrier metal 20a and the metal portions 20b and 21 remain only in the contact hole 19a and the grooves 19b and 19b'.

In this manner, the second-level wiring layer and the bonding pad having a lattice-like shape are formed, and at the same time, a contact plug which serves to electrically connect the first-level wiring layer and the second-level wiring layer to each other, is formed.

Next, as can be seen in FIG. 39, an etching stopper layer 29 and a passivation layer 22 are formed to be continuous, on the insulating layer 27, the second-level wiring layer and the bonding pad, by, for example, the CVD method.

The passivation layer 22 is made of, for example, silicon oxide. In the case where the passivation layer 22 is made of silicon oxide, the etching stopper layer 29 is made of a material having a high etching selectivity against silicon oxide in reactive ion etching (RIE), that is, for example, silicon nitride. The thickness of the etching stopper layer 29 is set to about 50 nm.

Figure 40:
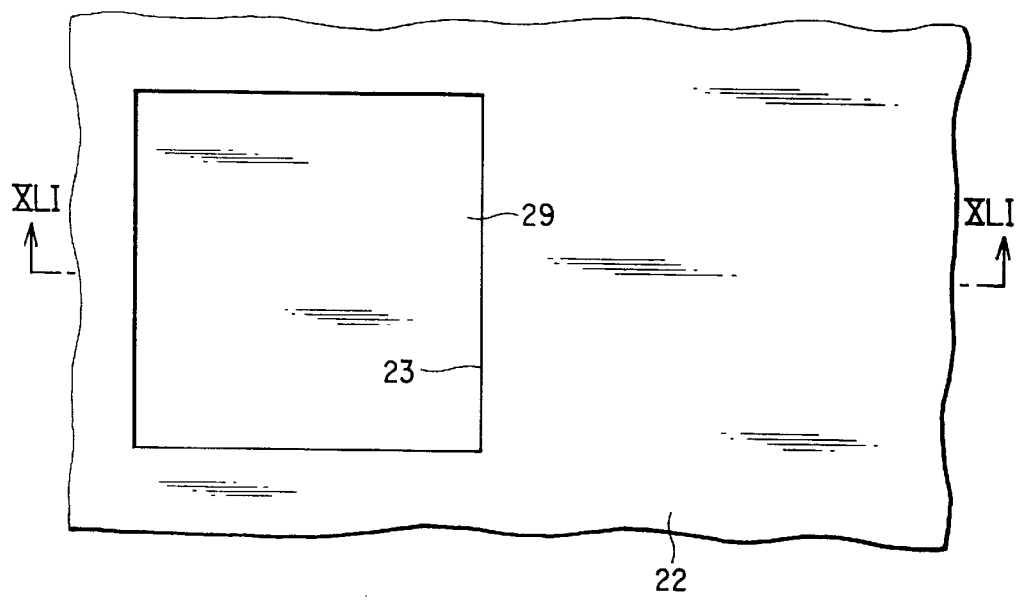
FIG. 40 is a plan view of a device, which illustrates a step of a manufacturing method according to the embodiment of the present invention.
Figure 41:
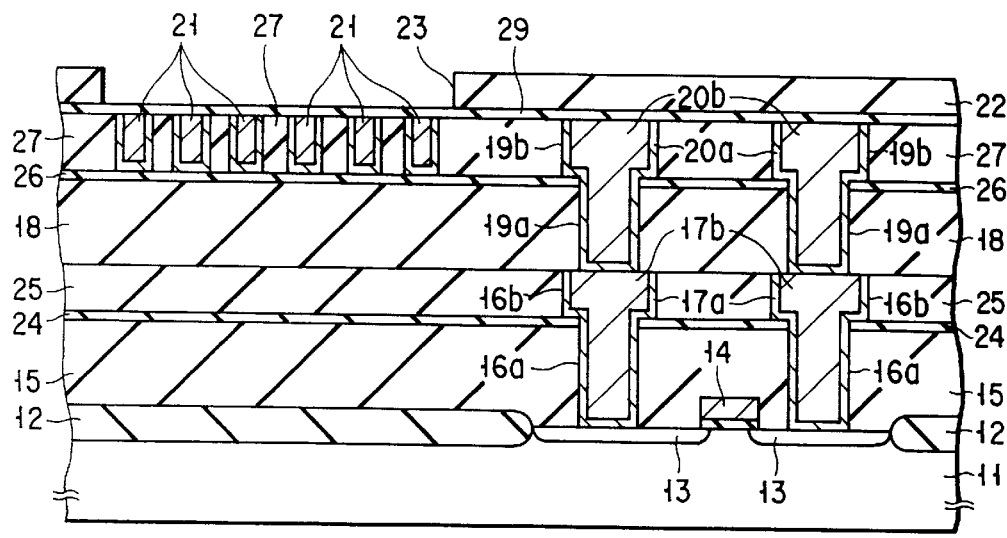
FIG. 41 is a cross sectional view taken along the line XLI—XLI indicated in FIG. 40.

Next, as can be seen in FIGS. 40 and 41, an opening 23 is formed in the passivation layer 22. The opening 23 is situated so as to the lattice-shaped bonding pad 21, and is formed by a photo engraving process, more specifically, the application of a resist on the insulating layer 22, the patterning of the resist, the etching of the insulating layer 22 by RIE using the resist as a mask, and the removal of the resist.

In the RIE operation for making the opening 23, the insulating layer 27 is not etched in the presence of the insulating layer 27.

Figure 42:
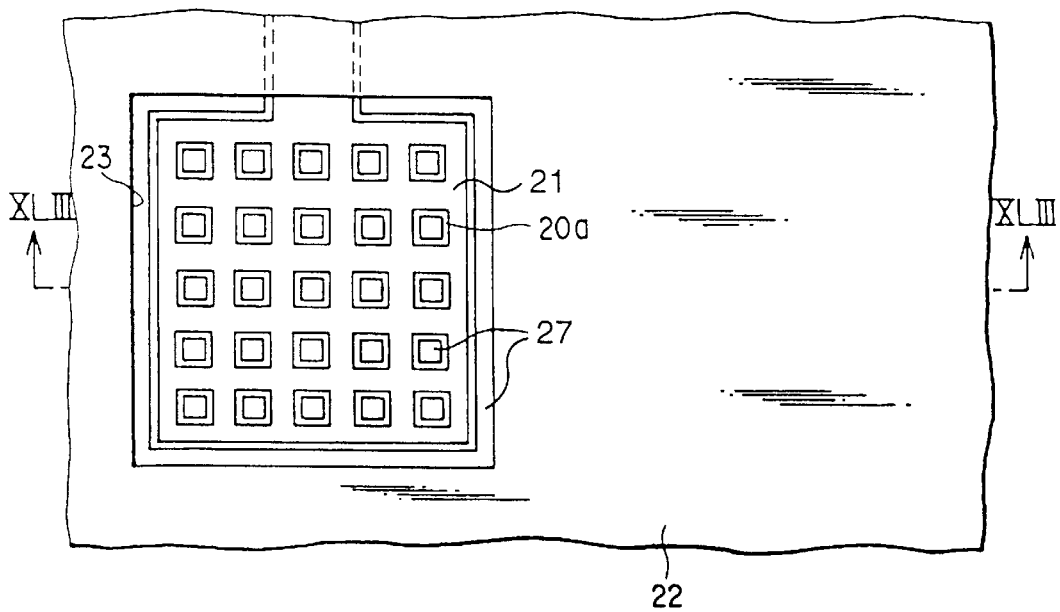
FIG. 42 is a plan view of a device, which illustrates a step of a manufacturing method according to an embodiment of the present invention.
Figure 43:
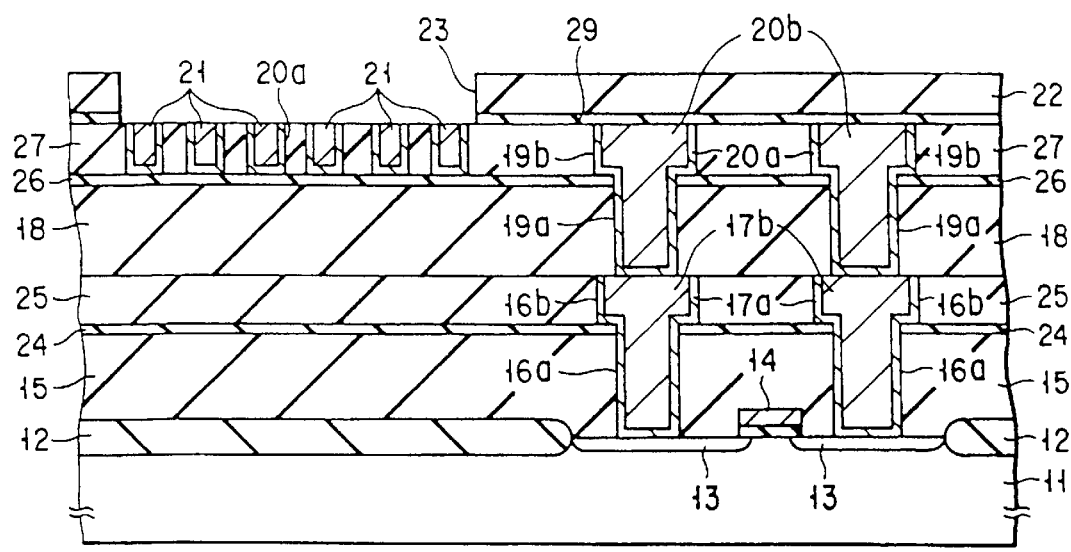
FIG. 43 is a cross sectional view taken along the line XLIII—XLIII indicated in FIG. 42.

Then, as can be seen in FIGS. 42 and 43, only the etching stopper layer 29 remaining in the bottom of the opening 23 of the passivation layer 22 is removed. The removal of the etching stopper layer 29 can be achieved by anisotropic etching such as RIE, or isotropic etching such as chemical dry etching (CDE).

As described above, the semiconductor device shown in FIGS. 25 and 26 is completed.

The feature of the above-described method is that the etching stopper layer 29 is provided directly underneath the passivation layer 22. With this structure, in the RIE operation carried out to made the opening 23 in the bonding pad 21, the sections of the insulating layer 27 formed in the lattice-like pattern of the bonding pad 21 are not etched.

More specifically, as can be seen in FIGS. 44 and 45, the recessed pattern of the lattice-shaped bonding pad 21 is filled with the insulating layer 27. With this structure, even if the wire bonding is carried out, the wire 28 does not squash or deform the lattice-shaped bonding pad 21.

Therefore, the bonding error can be avoided, thereby making it possible to improve the reliability and yield of the product.

As described above, with the semiconductor device and the method of manufacturing such a device, according to the present invention, the following effect can be obtained.

That is, directly underneath the passivation layer, an etching stopper layer is provided. Therefore, in the RIE operation for making an opening to expose the bonding pad, the portions of the insulating layer, which are situated at the recessed portions of the lattice shape, are not etched. Consequently, each section between adjacent recessed portions is filled with the insulation layer. With this structure, if a wire bonding is carried out, the wire cannot squash or deform the bonding pad having a lattice-like shape. Thus, the bonding error can be prevented, thereby making it possible to improve the reliability and yield of the product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a semiconductor element formed on said semiconductor substrate;

a first insulating layer formed above said semiconductor element and having a flat upper surface, a plurality of first grooves and a second groove formed therein, said plurality of first grooves separating a plurality of insulating pillars in a lattice pattern, each pillar having a flat upper surface;

a first layer of conductive material formed in the first grooves, said first layer of conductive material functioning as a bonding pad and having a flat upper surface;

a passivation layer formed above said first insulating layer and having an opening exposing said first layer of conductive material;

a second layer of conductive material formed in the second groove forming a wiring layer;

a second insulating layer formed between said first insulating layer and said passivation layer, said second insulating layer being of a material having a high etch selectivity compared to the passivation layer, said second insulating layer having an opening coinciding with said opening in said passivation layer;

wherein the upper surfaces of said first insulating layer, said insulating pillars, and said first layer of conductive material are coplanar; the second groove comprising a depression for containing the wiring layer and a hole containing a contact plug, the hole being located directly under the depression, the second groove thereby having a dual-damascene structure.

2. A semiconductor device according to claim 1, wherein said first insulating layer and said passivation layer are made of silicon oxide, and the second insulating layer is made of silicon nitride.

3. A semiconductor device according to claim 1, wherein said first layer of conductive material and said second layer of conductive material are comprised of a first metal layer and a second metal layer made of different materials.

4. A semiconductor device according to claim 2, wherein said first layer of conductive material and said second layer of conductive material are comprised of a first metal layer and a second metal layer made of different materials.

5. A semiconductor device according to claim 3, wherein said first metal layer is made of one of titanium and titanium nitride or silicon titanium nitride, and said second metal layer is made of one of aluminum, copper or an alloy thereof.

6. A semiconductor device according to claim 4, wherein said first metal layer is made of one of titanium and titanium nitride or silicon titanium nitride, and said second metal layer is made of one of aluminum, copper or an alloy thereof.

7. A semiconductor device according to claim 1, further comprising a bonding wire connected to said first layer of conductive material.

8. A semiconductor device according to claim 2, further comprising a bonding wire connected to said first layer of conductive material.

9. A semiconductor device according to claim 3, further comprising a bonding wire connected to said first layer of conductive material.

10. A semiconductor device according to claim 4, further comprising a bonding wire connected to said first layer of conductive material.

11. A semiconductor device according to claim 5, further comprising a bonding wire connected to said first layer of conductive material.

12. A semiconductor device according to claim 6, further comprising a bonding wire connected to said first layer of conductive material.

* * * * *